(12) United States Patent
Arita et al.

(10) Patent No.: US 9,441,069 B2
(45) Date of Patent: Sep. 13, 2016

(54) EPOXY RESIN, METHOD FOR PRODUCING EPOXY RESIN, EPOXY RESIN COMPOSITION, CURED PRODUCT THEREOF, AND HEAT-DISSIPATING RESIN MATERIAL

(71) Applicant: DIC Corporation, Tokyo (JP)

(72) Inventors: Kazuo Arita, Ichihara (JP); Hajime Watanabe, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/389,068

(22) PCT Filed: Mar. 19, 2013

(86) PCT No.: PCT/JP2013/057852
§ 371 (c)(1),
(2) Date: Sep. 29, 2014

(87) PCT Pub. No.: WO2013/146478
PCT Pub. Date: Oct. 3, 2013

(65) Prior Publication Data
US 2015/0104651 A1   Apr. 16, 2015

(30) Foreign Application Priority Data
Mar. 27, 2012 (JP) ................................. 2012-071287

(51) Int. Cl.
*B32B 27/38* (2006.01)
*C08G 59/22* (2006.01)
(Continued)

(52) U.S. Cl.
CPC ........... *C08G 59/22* (2013.01); *C08G 59/1494* (2013.01); *C08G 59/245* (2013.01); *C08J 5/24* (2013.01); *C08J 7/047* (2013.01); *C08K 3/22* (2013.01); *C08L 63/00* (2013.01);
(Continued)

(58) Field of Classification Search
None
See application file for complete search history.

(56) References Cited

U.S. PATENT DOCUMENTS 3,936,575 A * 2/1976 Watanabe ............ H05K 1/0326
156/330

FOREIGN PATENT DOCUMENTS

| JP | 2009-185116 A | 8/2009 |
| JP | 2009-242572 A | 10/2009 |
| JP | 2011-099049 A | 5/2011 |

OTHER PUBLICATIONS

Onda, Shinji, JP2009185116 machine translation, Aug. 20, 2009.*
(Continued)

*Primary Examiner* — Coris Fung
(74) *Attorney, Agent, or Firm* — Locke Lord LLP; James E. Armstrong, IV; Nicholas J. DiCeglie, Jr.

(57) ABSTRACT

The present invention provides an epoxy resin having a low melting point, low melt viscosity, excellent solvent solubility, and excellent processability. Also, the present invention provides an epoxy resin composition and a cured product thereof having excellent fluidity, processability, flexibility, adhesion, and thermal conductivity. The epoxy resin is represented by general formula (I) below (Q: an alkylene chain having a C1-C9 linear part which may have a C1-C18 alkyl group in a side chain, or a linkage chain having an ether bond present between two continuous methylene groups in the alkylene chain; A: a phenylene unit in which 2 to 4 phenylene groups are bonded directly or through a linkage chain, or a naphthylene unit, n: 0 to 10). The epoxy resin composition contains the epoxy resin and a curing agent. The composition includes the epoxy resin.

14 Claims, 10 Drawing Sheets

(51) Int. Cl.
    *C08L 63/00*     (2006.01)
    *C08G 59/14*     (2006.01)
    *C08G 59/24*     (2006.01)
    *H05K 1/03*     (2006.01)
    *C08J 7/04*     (2006.01)
    *H05K 1/02*     (2006.01)
    *C08J 5/24*     (2006.01)
    *C08K 3/22*     (2006.01)
    *H05K 3/46*     (2006.01)
    *C08K 7/18*     (2006.01)

(52) U.S. Cl.
    CPC ......... H05K 1/0209 (2013.01); H05K 1/0326 (2013.01); *C08J 2363/00* (2013.01); *C08K 7/18* (2013.01); *C08K 2003/2227* (2013.01); *H05K 3/4676* (2013.01); *H05K 2201/0209* (2013.01); *Y10T 428/31529* (2015.04)

(56) References Cited

OTHER PUBLICATIONS

Kaji et al., machine translation of JP 2009-242572, Oct. 22, 2009.*
International Search Report mailed Apr. 23, 2013, issued for PCT/JP2013/057852.

\* cited by examiner

EPOXY RESIN, METHOD FOR PRODUCING EPOXY RESIN, EPOXY RESIN COMPOSITION, CURED PRODUCT THEREOF, AND HEAT-DISSIPATING RESIN MATERIAL

TECHNICAL FIELD

The present invention relates to an epoxy resin useful as a heat-dissipating material, a method for producing the epoxy resin, an epoxy resin composition, a cured product thereof, and a heat-dissipating resin material.

BACKGROUND ART

Epoxy resin compositions each containing an epoxy resin and a curing agent therefor as essential components are excellent in physical properties such as heat resistance, moisture resistance, etc., and are thus widely used for electronic components such as a semiconductor encapsulating material, a printed circuit board, and the like, the electronic component field, conductive adhesives such as conductive paste, and the like, other adhesives, matrixes for composite materials, coating materials, photoresist materials, color developing materials, etc.

Among these applications, semiconductor devices for converting a direct current to an alternating current and for finely controlling current flows and voltage rise and fall have recently attracted particular attention, and are called "power semiconductor", "power device", or "power module". The power semiconductors provide a technique essential for increasing power efficiency and energy saving, and applications such as motor control for automotive cars, power control for solar power generation, wind power generation, and the like extend from day to day.

A problem of such power semiconductors lies in how to dissipate with high efficiency the large heat generated, and a rate-determining factor of heat dissipation efficiency lies in a thermal interface material (TIM) for the purpose of decreasing contact thermal resistance between a semiconductor portion and a heat sink.

TIM is mainly composed of an inorganic filler and a matrix resin, and silicone-based thermally conductive grease has been used as the matrix resin of TIM. However, required levels of performances such as thermal conductivity, resistance to thermal decomposition, adhesion to substrates, etc. are increased more and more with increases in density of semiconductor devices and amounts of electric power to be controlled, and thus it is becoming difficult for usual silicone-based heat-conductive grease to comply with this problem.

The characteristics required for TIM are roughly divided into two: (1) efficient heat transfer from a heating element to a heat-dissipating member, and (2) flexible following of thermal deformation of the heating element and heat-dissipating member. Many usual epoxy resins have been developed with importance placed on heat resistance, and have unsatisfactory thermal conductivity and low flexibility because they have relatively rigid skeletons. On the other hand, polymer materials having good flexibility produce large phonon scattering and thus have low thermal conductivity, and thus development of highly thermally conductive epoxy resins optimum for TIM has been expected.

For example, an epoxy resin represented by general formula (3) or general formula (4) below has been proposed as a resin material having excellent thermal conductivity when composited with an inorganic filler (refer to Patent Literature 1 below).

[Chem. 1]

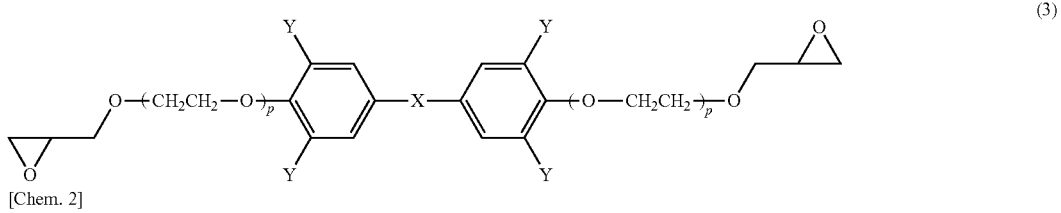

(3)

[Chem. 2]

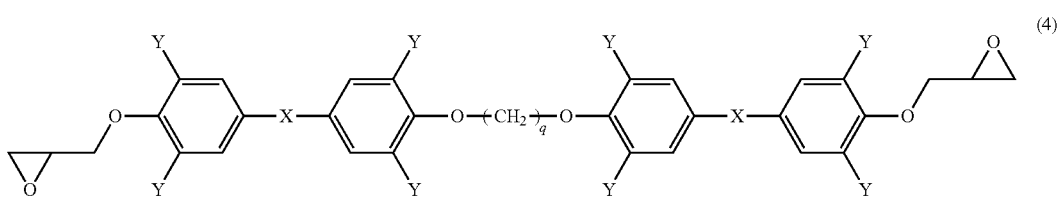

(4)

(In the formulae, X represents a single bond, a —CH=CH— group, a —COO— group, a —CONH— group, or a —CO— group, Y represents a hydrogen atom or a methyl group, p represents a number of 0 to 6, and q represents a number of 1 to 18.)

The epoxy resin has excellent thermal conductivity as compared with usual epoxy resins, but has thermal conductivity at an unsatisfactory level and poor adhesion to substrates.

CITATION LIST

Patent Literature

PTL 1: Japanese Unexamined Patent Application Publication No. 2009-242572

SUMMARY OF INVENTION

Technical Problem

A problem to be solved by the present invention is to provide an epoxy resin excellent in thermal conductivity and substrate adhesion and useful as a matrix resin for TIM and as other electronic device materials, and also provide a method for producing the epoxy resin, an epoxy resin composition, a cured product thereof, and a heat-dissipating resin material.

Solution to Problem

As a result of extensive research conducted for solving the problem, the inventors found that an epoxy resin represented by general formula (I) below has high alignment and thus produces a cured product with high thermal conductivity and further has excellent substrate adhesion,

[Chem. 3]

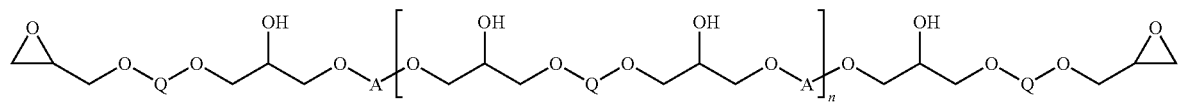

(I)

[in the formula, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

[Chem. 4]

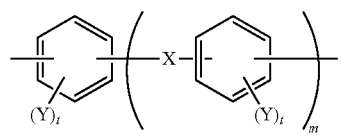

(i)

{in the formula, Y each independently represent a halogen atom, a hydrocarbon group having 1 to 8 carbon atoms, or an alkoxyl group having 1 to 8 carbon atoms; X represents a single bond, a —O— group, a —CH=CH— group, a —CH=C(CH$_3$)— group, a —CH=C(CN)— group, a —C≡C— group, a —CH=N— group, a —CH=CH—CO— group, a —N=N— group, a —COO— group, a —CONH— group, or a —CO— group; l each independently represent an integer of 0 to 4; and m represents an integer of 1 to 3}, or a naphthylene unit represented by general formula (ii) below

[Chem. 5]

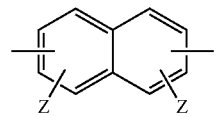

(ii)

{in the formula, Z each independently represent a hydrogen atom, a halogen atom, a hydrocarbon group having 1 to 8 carbon atoms, or an alkoxyl group having 1 to 8 carbon atoms}; and n represents an integer of 0 to 10], leading to the achievement of the present invention.

That is, the present invention relates to an epoxy resin represented by general formula (I) below,

[Chem. 6]

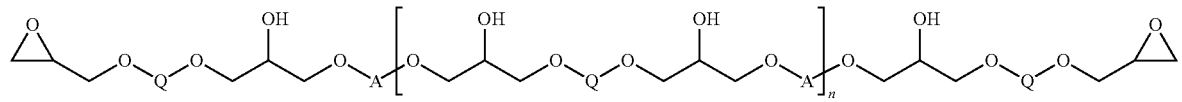

(I)

[in the formula, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

[Chem. 7]

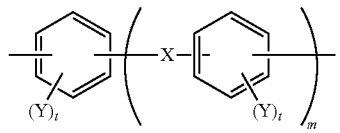

(i)

{in the formula, Y each independently represent a halogen atom, a hydrocarbon group having 1 to 8 carbon atoms, or an alkoxyl group having 1 to 8 carbon atoms; X represents a single bond, a —O— group, a —CH=CH— group, a —CH=C(CH$_3$)— group, a —CH=C(CN)— group, a —C≡C— group, a —CH=N— group, a —CH=CH—CO— group, a —N=N— group, a —COO— group, a —CONH— group, or a —CO— group; l each independently represent an integer of 0 to 4; and m represents an integer of 1 to 3}, or a naphthylene unit represented by general formula (ii) below

[Chem. 8]

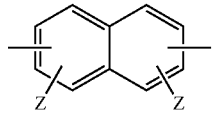

(ii)

{in the formula, Z each independently represent a hydrogen atom, a halogen atom, a hydrocarbon group having 1 to 8 carbon atoms, or an alkoxyl group having 1 to 8 carbon atoms}; and n represents an integer of 0 to 10].

The present invention further relates to a method for producing an epoxy resin, the method including reacting a diol compound (a) with at least one diglycidyl ether compound (q), the diol compound (a) being represented by general formula (1),

[Chem. 9]

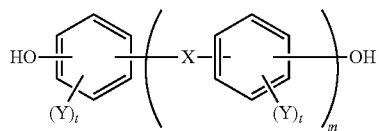

(1)

{in the formula, Y each independently represent a halogen atom, a hydrocarbon group having 1 to 8 carbon atoms, or an alkoxyl group having 1 to 8 carbon atoms; X represents a single bond, a —O— group, a —CH═CH— group, a —CH═C(CH$_3$)— group, a —CH═C(CN)— group, a —C≡C— group, a —CH═N— group, a —CH═CH—CO— group, a —N═N— group, a —COO— group, a —CONH— group, or a —CO— group; l each independently represent an integer of 0 to 4; and m represents an integer of 1 to 3}, or general formula (2) below,

[Chem. 10]

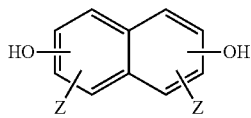

(2)

{in the formula, Z each independently represent a hydrogen atom, a halogen atom, a hydrocarbon group having 1 to 8 carbon atoms, or an alkoxyl group having 1 to 8 carbon atoms}, and the at least one diglycidyl ether compound (q) being selected from the group consisting of a diglycidyl ether of a linear alkylene diol having 1 to 9 carbon atoms, a diglycidyl ether of a branched alkylene diol having a structure in which an alkyl group having 1 to 18 carbon atoms is bonded to a carbon atom of the linear alkylene diol, and a diglycidyl ether of a diol compound having an ether bond present between two continuous methylene groups in the alkylene diol.

The present invention further relates to an epoxy resin produced by the production method.

The present invention further relates to an epoxy resin composition containing the epoxy resin and a curing agent.

The present invention further relates to a cured product of the epoxy resin composition.

The present invention further relates to a heat-dissipating material containing the epoxy resin, a curing agent, and an inorganic filler, wherein a ratio of the inorganic filler is within a range of 20% to 95% by mass.

The present invention further relates to a semiconductor encapsulating material containing the epoxy resin, a curing agent, and an inorganic filler, wherein a ratio of the inorganic filler is within a range of 20% to 95% by mass.

The present invention further relates to a prepreg produced by semi-curing an impregnated substrate which is formed by impregnating a reinforcement substrate with a composition containing the epoxy resin, a curing agent, and an organic solvent.

The present invention further relates to a circuit board produced by heat-pressure-molding a plate-shaped material and a copper foil laminated on a surface of the plate, the plate-shaped material being composed of a varnish containing the epoxy resin, a curing agent, and an organic solvent.

The present invention further relates to a build-up film produced by applying a composition containing the epoxy resin, a curing agent, and an organic solvent on a substrate film and then drying the composition.

Advantageous Effects of Invention

According to the present invention, it is possible to provide an epoxy resin excellent in thermal conductivity and substrate adhesion and useful as a matrix resin for TIM and as other electronic device materials, and also provide a method for producing the epoxy resin, an epoxy resin composition, a cured product of the composition, and a heat-dissipating resin material.

DESCRIPTION OF EMBODIMENTS

Figure 1:
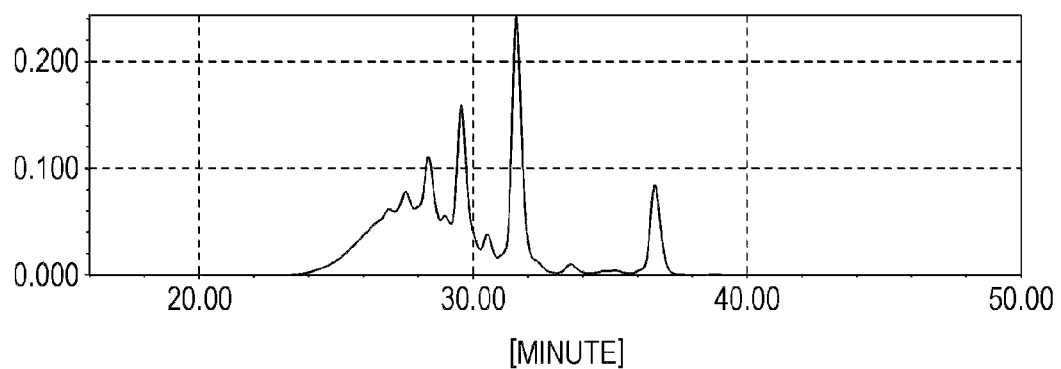
FIG. 1 is a GPC chart of epoxy resin (A-1) produced in Example 1.

An epoxy resin of the present invention is represented by general formula (I) below,

[Chem. 11]

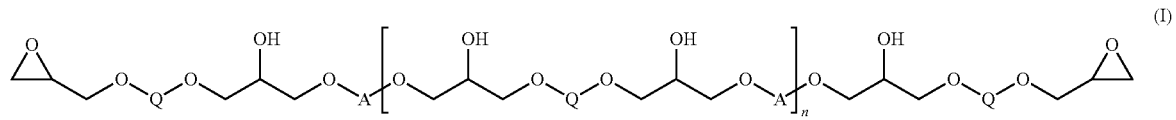

(I)

[in the formula, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

[Chem. 12]

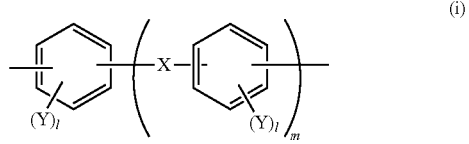

(i)

{in the formula, Y each independently represent a halogen atom, a hydrocarbon group having 1 to 8 carbon atoms, or an alkoxyl group having 1 to 8 carbon atoms; X represents a single bond, a —O— group, a —CH=CH— group, a —CH=C(CH$_3$)— group, a —CH=C(CN)— group, a —C≡C— group, a —CH=N— group, a —CH=CH—CO— group, a —N=N— group, a —COO— group, a —CONH— group, or a —CO— group; l each independently represent an integer of 0 to 4; and m represents an integer of 1 to 3}, or a naphthylene unit represented by general formula (ii) below

[Chem. 13]

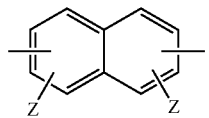

(ii)

{in the formula, Z each independently represent a hydrogen atom, a halogen atom, a hydrocarbon group having 1 to 8 carbon atoms, or an alkoxyl group having 1 to 8 carbon atoms}; and n represents a number of 0 to 10].

In the general formula (I), Q is a structural site such as an alkylene chain or the like, which is rich in flexibility, and a resin having a molecular structure having flexible structures at both ends thereof is a resin excellent in thermal conductivity and substrate adhesion. Also, A is an aromatic nucleus-containing site represented by the general formula (i) or (ii), and a resin having such an aromatic nucleus-containing site present between two flexible structures represented by Q is a resin further excellent in heat resistance and thermal decomposition resistance while maintaining high performance such as thermal conductivity and substrate adhesion, flexibility, etc. Further, a plurality of hydroxyl groups present in the molecular structure have the effect of further improving thermal conductivity and substrate adhesion of a resin.

In the general formula (I), Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain. Among these, a linear alkylene chain having 3 to 7 carbon atoms or a linkage chain having an ether bond present between two continuous methylene groups in the alkylene chain is preferred because a cured product with more excellent thermal conductivity, substrate adhesion, and flexibility can be produced. Specifically, any one of a propylene group, a butylene group, a pentylene group, a hexylene group, a heptylene group, and an ethyleneoxyethylene group is preferred.

In the general formula (I), A each independently represent a phenylene unit represented by the general formula (i) or a naphthylene unit represented by the general formula (ii). In particular, because a cured product with more excellent thermal conductivity and excellent heat resistance and thermal decomposition resistance can be produced, a structural site represented by any one of general formulae (i-1) to (i-3) and (ii-1) is preferred.

[Chem. 14]

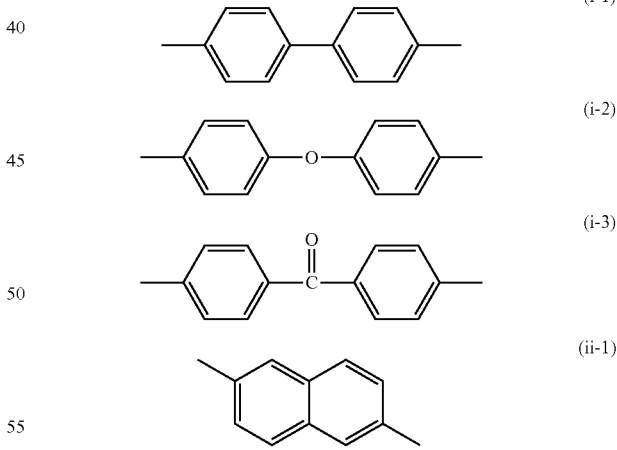

In the general formula (I), n is an integer of 0 to 10. In particular, because the epoxy resin has a low melting point and low viscosity and excellent solvent solubility, a value of n is preferably within a range of 0 to 6 and more preferably within a range of 0 to 3.

The epoxy resin of the present invention represented by the general formula (I) can be easily produced by reacting, according to a normal method, a diol compound (a) represented by general formula (1),

[Chem. 15]

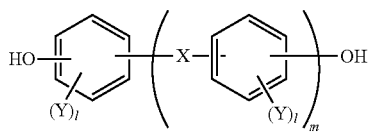

(1)

{in the formula, Y each independently represent a halogen atom, a hydrocarbon group having 1 to 8 carbon atoms, or an alkoxyl group having 1 to 8 carbon atoms; X represents a single bond, a —O— group, a —CH=CH— group, a —CH=C(CH$_3$)— group, a —CH=C(CN)— group, a —C≡C— group, a —CH=N— group, a —CH=CH—CO— group, a —N=N— group, a —COO— group, a —CONH— group, or a —CO— group; l each independently represent an integer of 0 to 4; and m represents an integer of 1 to 3}, or general formula (2) below,

[Chem. 16]

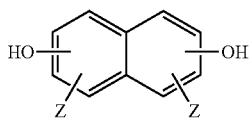

(2)

{in the formula, Z each independently represent a hydrogen atom, a halogen atom, a hydrocarbon group having 1 to 8 carbon atoms, or an alkoxyl group having 1 to 8 carbon atoms}, with at least one diglycidyl ether compound (q) selected from the group consisting of a diglycidyl ether of a linear alkylene diol having 1 to 9 carbon atoms, a diglycidyl ether of a branched alkylene diol having a structure in which an alkyl group having 1 to 18 carbon atoms is bonded to a carbon atom of the linear alkylene diol, and a diglycidyl ether of a diol compound having an ether bond present between two continuous methylene groups in the alkylene diol.

Because the epoxy resin has more excellent thermal conductivity and excellent heat resistance and thermal decomposition resistance, the diol compound (a) represented by the general formula (1) or (2) is preferably a diol compound represented by any one of general formulae (I-1) to (1-3) and (2-1),

[Chem. 17]

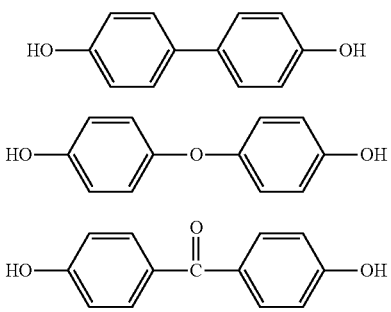

(1-1)

(1-2)

(1-3)

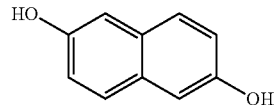

(2-1)

Examples of a diglycidyl ether of a linear alkylene diol having 1 to 9 carbon atoms as the diglycidyl ether compound (q) include ethylene glycol diglycidyl ether, 1,3-propanediol diglycidyl ether, 1,4-butanediol diglycidyl ether, 1,5-pentanediol diglycidyl ether, 1,6-hexanediol diglycidyl ether, 1,7-heptanediol diglycidyl ether, 1,8-octanediol diglycidyl ether, and 1,9-nonanediol diglycidyl ether.

Examples of a diglycidyl ether of a branched alkylene diol having a structure in which an alkyl group having 1 to 18 carbon atoms is bonded to a carbon atom of the linear alkylene diol having 1 to 9 carbon atoms include 1,2-propanediol diglycidyl ether, 1,2-butanediol diglycidyl ether, 1,2-pentanediol diglycidyl ether, 1,2-hexanediol diglycidyl ether, 1,2-heptanediol diglycidyl ether, 1,2-octanediol diglycidyl ether, 1,8-nonanediol diglycidyl ether, 1,9-decanediol diglycidyl ether, 1,3-butanediol diglycidyl ether, 1,3-pentanediol diglycidyl ether, 1,3-hexanediol diglycidyl ether, 1,3-heptanediol diglycidyl ether, 1,3-octanediol diglycidyl ether, 1,3-nonanediol diglycidyl ether, 1,3-decanediol diglycidyl ether, 1,4-pentanediol diglycidyl ether, 1,4-hexanediol diglycidyl ether, 1,4-heptanediol diglycidyl ether, 1,4-octanediol diglycidyl ether, 1,4-nonanediol diglycidyl ether, 1,4-decanediol diglycidyl ether, 1,5-hexanediol diglycidyl ether, 1,5-heptanediol diglycidyl ether, 1,5-octanediol diglycidyl ether, 1,5-nonanediol diglycidyl ether, 1,5-decanediol diglycidyl ether, 1,6-heptanediol diglycidyl ether, 1,6-octanediol diglycidyl ether, 1,6-nonanediol diglycidyl ether, 1,6-decanediol diglycidyl ether, 1,7-octanediol diglycidyl ether, 1,7-nonanediol diglycidyl ether, 1,7-decanediol diglycidyl ether, 1,8-nonanediol diglycidyl ether, 1,8-decanediol diglycidyl ether, 1,9-decanediol diglycidyl ether, and the like.

Examples of a diglycidyl ether of a diol compound having an ether bond present between two continuous methylene groups in the alkylene diol include diethylene glycol diglycidyl ether, triethylene glycol diglycidyl ether, tetraethylene glycol diglycidyl ether, pentaethylene glycol diglycidyl ether, dipropylene glycol diglycidyl ether, tripropylene glycol diglycidyl ether, tetrapropylene glycol diglycidyl ether, dibutylene glycol diglycidyl ether, and the like.

Among these diglycidyl ether compounds (q), a diglycidyl ether of a linear alkylene glycol having 2 to 7 carbon atoms or a diglycidyl ether of a diol compound having an ether bond present between two continuous methylene groups in the alkylene chain is preferred because the resultant epoxy resin has more excellent thermal conductivity, substrate adhesion, and flexibility. Specifically, ethylene glycol diglycidyl ether, propylene glycol diglycidyl ether, 1,4-butanediol diglycidyl ether, 1,5-pentanediol diglycidyl ether, 1,6-hexanediol diglycidyl ether, and diethylene glycol diglycidyl ether are particularly preferred.

Reaction between the diol compound (a) and the diglycidyl ether compound (q) is not particularly limited, and reaction conditions may be properly selected so as to achieve an appropriate grafting rate and not to cause gelation. Specifically, a method of reacting the raw materials is performed under, for example, reaction conditions of 20° C. to 200° C., if required, in the presence of a catalyst.

Examples of the catalyst which can be used include, but are not particularly limited to, alkali metal hydroxides such as sodium hydroxide, potassium hydroxide, and the like; tertiary amines such as triethylamine, benzyldimethylamine, and the like; quaternary ammonium salts such as tetramethylammonium chloride, tetramethylammonium bromide, trimethylbenzylammonium chloride, and the like; imidazole compounds; triphenylphosphine; and the like.

A reaction ratio between the diol compound (a) and the diglycidyl ether compound (q) is preferably a theoretical equivalent ratio or within a range of the theoretical equivalent ratio ±10%.

The reaction may be performed under solvent-less conditions or by using a proper organic solvent. When the organic solvent is used, the organic solvent is not particularly limited as long as it is an inert solvent for the reaction, but a hydrophilic solvent is preferred in view of the point that the formation of by-products is easily suppressed. Examples of the hydrophilic solvent include alcohol solvents such as methanol, ethanol, propanol, butanol, ethylene glycol, propylene glycol, and the like; ketone solvents such as methyl ethyl ketone, methyl isobutyl ketone, and the like; aprotic polar solvents such as N,N-dimethylformamide, dimethylsulfoxide, N-methylpyrrolidone, and the like; and ether solvents such as tetrahydrofuran, dioxane, methoxy methyl ether, diethoxyethane, and the like. These solvents may be used alone or as a mixture of two or more. Among these solvents, an ether solvent, an aprotic polar solvent, and a mixed solvent thereof are preferred, the aprotic polar solvent is more preferred, and dimethylsulfoxide is particularly preferred. The amount of the solvent used is generally 0.1 to 50 parts by weight, preferably 0.5 to 5 parts by weight, relative to the total mass of the diol compound (a) and the diglycidyl ether compound (q).

The epoxy resin of the present invention preferably has crystallinity from the viewpoint of high heat resistance, low thermal expansion, and high thermal conductivity of a cured molded product thereof. The expression of crystallinity of the epoxy resin can be confirmed by observing, as a melting point, an endothermic peak with melting of crystals in differential scanning calorimetry. A DSC melting point is preferably in a range of 20° C. to 250° C. and more preferably in a range of 30° C. to 200° C. A value of thermal conductivity of the cured molded product is preferably as high as possible, but is preferably 4 W/m·K or more and less than 6 W/m·K and particularly preferably 5 W/m·K or more.

An epoxy resin composition of the present invention can contain another epoxy resin used in combination of the epoxy resin represented by the general formula (I) within a range where the characteristics are not impaired. Examples of the other epoxy resin include glycidyl ether compounds derived from dihydric phenols such as bisphenol A, bisphenol F, 3,3',5,5'-tetramethyl-4,4'-dihydroxydiphenylmethane, 4,4'-dihydroxydiphenylsulfone, 4,4'-dihydroxydiphenylsulfide, fluorene bisphenol, 2,2'-biphenol, resorcin, catechol, tert-butylcatechol, tert-butylhydroquinone, allylated bisphenol A, allylated bisphenol F, dihydroxyphenyl ether, dihydroxybenzophenone, allylated phenol novolac, and the like; tri- or higher hydric phenols such as phenol novolac, bisphenol A novolac, o-cresol novolac, m-cresol novolac, p-cresol novolac, xylenol novolac, poly-p-hydroxystyrene, tris-(4-hydroxyphenyl)methane, 1,1,2,2-tetrakis(4-hydroxyphenyl)ethane, fluoroglycinol, pyrogallol, tert-butylpyrogallol, allylated pyrogallol, poly-allylated pyrogallol, 1,2,4-benzenetriol, 2,3,4-trihydroxybenzophenone, phenol aralkyl resins, naphthol aralkyl resins, dicyclopentadiene resins, and the like; halogenated bisphenols such as tetrabromobisphenol A and the like; polyhydroxynaphthalene; hexanediol; polyethylene glycol; and the like. Among these, bisphenol-based epoxy resins are preferred. These epoxy resins can be used alone or in combination of two or more.

Also, if required, a thermosetting resin composition of the present invention can be properly combined with another thermosetting resin. Examples of the other thermosetting resin which can be used include cyanate ester compounds, vinylbenzyl compounds, acryl compounds, maleimide compounds, and the like. When the other thermosetting resin is combined, the amount of use is not particularly limited within a range where the effect of the present invention is not impaired, but the amount is preferably in a range of 1% to 80% by weight relative to the thermosetting resin composition of the present invention.

A curing agent used in the epoxy resin composition of the present invention may be any curing agent having, in its molecule, at least two functional groups which can produce curing reaction with an epoxy group, and, for example, an amine-based curing agent having amino groups as the functional groups, a phenol-based curing agent having hydroxyl groups as the functional groups, an acid anhydride-based curing agent having carboxyl groups as the functional groups, or the like can be used, and the amine-based curing agent or the phenol-based curing agent is preferred.

Examples of the amine-based curing agent include aliphatic polyvalent amines having 2 to 20 carbon atoms, such as ethylene diamine, trimethylene diamine, tetramethylene diamine, hexamethylene diamine, diethylene triamine, triethylene tetramine, and the like; aromatic polyvalent amines such as p-xylenediamine, m-xylenediamine, 1,5-diaminonaphthalene, m-phenylenediamine, p-phenylenediamine, 4,4'-diaminodiphenylmethane, 4,4'-diaminodiphenylethane, 4,4'-diaminodiphenylpropane, 4,4'-diaminodiphenyl ether, 1,1-bis(4-aminophenyl)cyclohexane, 4,4'-diaminodiphenylsulfone, bis(4-aminophenyl)phenylmethane, and the like; alicyclic polyvalent amines such as 4,4'-diaminodicyclohexane, 1,3-bisaminomethylcyclohexane, and the like; dicyandiamide; and the like. Among these amine-based curing agents, the aromatic polyvalent amines are preferred, and 4,4'-diaminodiphenylmethane, 4,4'-diaminodiphenylethane, 1,5-diaminonaphthalene, and p-phenylenediamine are more preferred.

Examples of the phenol-based curing agent include phenol resins, phenol aralkyl resins (having a phenylene skeleton, a diphenylene skeleton, or the like), naphthol aralkyl resins, polyoxystyrene resins, and the like. Examples of the phenol resins include resole-type phenol resins such as aniline-modified resole resins, dimethyl ether resole resins, and the like; novolac-type phenol resins such as phenol novolac resins, cresol novolac resins, tert-butylphenol novolac resins, nonylphenol novolac resins, and the like; special phenol resins such as dicyclopentadiene-modified phenol resins, terpene-modified phenol resins, triphenolmethane-type resins, and the like. Among these phenol-based curing agents, phenol novolac resins are preferred.

Examples of the acid anhydride-based curing agent include maleic anhydride, phthalic anhydride, pyromellitic anhydride, trimellitic anhydride, and the like.

These compounds can be used alone or in combination of two or more.

The amount of the curing agent used is such that in the curing agent, the total amount of functional groups which can produce curing reaction with epoxy groups is generally 0.5 to 1.5 times, preferably 0.9 to 1.1 times, the total amount of epoxy groups in the epoxy resin composition.

The epoxy resin composition of the present invention may further contain an inorganic filler, an organic solvent, a flame retardant, a curing accelerator, and other additives.

Examples of the inorganic filler include silica powders such as fused crushed silica powder, spherical fused silica powder, crystalline silica powder, secondary aggregated silica powder, and the like; inorganic fillers such as alumina, titanium white, aluminum hydroxide, talc, clay, mica, glass fibers, and the like; and thermally conductive fillers such as aluminum nitride, boron nitride, silicon nitride, silicon carbide, magnesia (aluminum oxide), alumina (aluminum oxide), crystalline silica (silicon oxide), fused silica (silicon oxide), and the like. These inorganic fillers may be surface-treated with a silane coupling agent, a titanate coupling agent, an aluminate coupling agent, or the like in order to improve wettability with resins. Among these, aluminum nitride, boron nitride, and silicon nitride are preferred, and combination of alumina and aluminum nitride, boron nitride, or silicon nitride may be used.

The ratio of the inorganic filler used is preferably in a range of 20% to 95% by mass, more preferably in a range of 50% to 95% by mass, of the composition containing the epoxy resin represented by the general formula (I) of the present invention, the curing agent, and the inorganic filler.

Examples of the organic solvent include ketone solvents such as methyl ethyl ketone, methyl isobutyl ketone, and the like; aprotic polar solvents such as dimethylsulfoxide, N-methylpyrrolidone, and the like; ester solvents such as butyl acetate and the like; glycol solvents such as propylene glycol monomethyl ether and the like; aromatic solvents such as toluene, xylene, and the like; aliphatic solvents such as mineral turpentine.

The flame retardant is not limited as long as it has the function as a flame retardant or a flame retardant aid, and examples thereof include a bromine-based flame retardant, a phosphorus-based flame retardant, an inorganic flame retardant, an organic metal salt-based flame retardant, and the like. Use of these flame retardants is not particularly limited, and they may be used alone or in combination of a plurality of flame retardants of the same type or different types.

Examples of the bromine-based flame retardant include polybrominated diphenyl oxide, decabromodiphenyl oxide, tris[3-bromo-2,2-bis(bromomethyl)propyl] phosphate, tris (2,3-dibromopropyl) phosphate, tetrabromophthalic acid, tetrabromobisphenol A bis(2,3-dibromopropyl ether), brominated epoxy resin, ethylene-bis(tetrabromophthalimide), octabromodiphenyl ether, 1,2-bis(tribromophenoxy)ethane, tetrabromo-bisphenol A, ethylenebis-(dibromo-norbornane dicarboximide), tris(2,3-dibromopropyl) isocyanurate, ethylene-bis-tetrabromophthalimide, and the like.

The ratio of the bromine-based flame retardant used is preferably 3 to 20 parts by mass in 100 parts by mass of the epoxy resin composition.

As the phosphorus-based flame retardant, either an inorganic compound or an organic compound can be used as long as it contains a phosphorus atom. Examples of an inorganic compound include red phosphorus which may be surface-treated for preventing hydrolysis or the like; ammonium phosphates such as monoammonium phosphate, diammonium phosphate, triammonium phosphate, ammonium polyphosphate, and the like; and inorganic nitrogen-containing phosphorus compounds such as phosphoric amide, and the like.

Examples of a surface treatment method for the red phosphorus include (i) a method of coating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a method of coating with a mixture of an inorganic compound, such as magnesium hydroxide, aluminum hydroxide, zinc hydroxide, or titanium hydroxide, and a thermosetting resin, such as a phenol resin, (iii) a doubly coating method of coating with a film of an inorganic compound such as magnesium hydroxide, aluminum hydroxide, zinc hydroxide, or titanium hydroxide, and coating the film with a thermosetting resin such as a phenol resin, or the like. The red phosphorus treated by any one of the methods (i) to (iii) can be used.

Examples of the organic phosphorus compound include phosphate compounds, phosphonic acid compounds, phosphinic acid compounds, phosphine oxide compounds, phospholan compounds, organic nitrogen-containing phosphorus compounds, and the like.

Typical examples of the phosphate compounds include triphenyl phosphate, resorcinol bis(diphenyl phosphate), resorcinol bis(di-2,6-xylenol phosphate), bisphenol A bis (diphenyl phosphate), bisphenol A bis(dicresyl phosphate), resorcinol diphenyl phosphate, and the like.

Examples of the phosphonic acid compounds include diphenylphosphinic acid, methylethylphosphinic acid, cyclic organic phosphorus compounds such as 9,10-dihydro-9-oxa-10-phosphaphenanthrene-10-oxide, 10-(2,5-dihydroxyphenyl)-10H-9-oxa-10-phosphaphenanthrene-10-oxide, 10-(2,7-dihydroxynaphthyl)-10H-9-oxa-10-phosphaphenanthrene-10-oxide, and the like; and derivatives produced by reaction of the phosphorus compounds with a compound such as an epoxy resin, a phenol resin, or the like.

Examples of the phosphine oxide compounds triphenylphosphine oxide, tris(3-hydroxypropyl)phosphine oxide, diphenylphosphinyl hydroquinone, and the like.

Examples of the organic nitrogen-containing phosphorus compounds include phosphazene compounds and the like.

A mixing amount is properly selected according to the type of the phosphorus-based flame retardant, the other components of the epoxy resin composition, and the desired degree of flame retardancy. For example, when red phosphorus is used as the flame retardant, the mixing amount is preferably within a range of 0.1 to 2.0 parts by mass in 100 parts by mass of the epoxy resin composition containing all of the epoxy resin, the curing agent, the flame retardant, and other filler and additives, and when an organic phosphorus compound is used, the mixing amount is preferably within a range of 0.1 to 10.0 parts by mass and particularly preferably within a range of 0.5 to 6.0 parts by mass.

Examples of the metal-based flame retardant include metal hydroxides, metal oxides, metal carbonate compounds, metal powders, boron compounds, and the like.

Examples of the metal hydroxides include aluminum hydroxide, magnesium hydroxide, dolomite, hydrotalcite, calcium hydroxide, barium hydroxide, zirconium hydroxide, composite metal hydroxides, and the like.

Examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, tungsten oxide, and the like.

Examples of the metal carbonate compounds include zinc carbonate, magnesium carbonate, calcium carbonate, barium carbonate, basic magnesium carbonate, aluminum carbonate, iron carbonate, cobalt carbonate, titanium carbonate, and the like.

Examples of the metal powders include powders of aluminum, iron, titanium, manganese, zinc, molybdenum, cobalt, bismuth, chromium, nickel, copper, tungsten, tin, and the like.

Examples of the boron compounds include zinc borate, zinc metaborate, barium metaborate, boric acid, borax, and the like.

When the metal-based flame retardant is combined, the mixing amount is appropriately selected according to the type of the metal-based flame retardant, the other components of the epoxy resin composition, and the desired degree of flame retardancy. For example, the flame retardant is preferably mixed in a range of 0.05 to 20 parts by mass, particularly preferably in a range of 0.5 to 15 parts by mass, in 100 parts by mass of the epoxy resin composition containing all of the epoxy resin, the curing agent, the flame retardant, and other filler and additives.

Examples of the organic metal salt-based flame retardant include ferrocene, acetylacetonate metal complexes, organic metal carbonyl compounds, organic cobalt salt compounds, organic sulfonic acid metal salts, compounds each having an ionic bond or coordinate bond between a metal atom and an aromatic compound or heterocyclic compound, and the like.

Examples of the organic cobalt salt compounds include cobalt-naphthenic acid complex, cobalt-ethylenediamine complex, cobalt-acetoacetonate complex, cobalt-piperizine complex, cobalt-cyclohexanediamine complex, cobalt-tetraazacyclotetradodecane complex, cobalt-ethylenediamine tetraacetate complex, cobalt-tetraethylene glycol complex, cobalt-aminoethanol complex, cobalt-cyclohexadiamine complex, cobalt-glycine complex, cobalt-triglycine complex, cobalt-naphthylidine complex, cobalt-phenanthroline complex, cobalt-pentanediamine complex, cobalt-pyridine complex, cobalt-salicylic acid complex, cobalt-salicylaldehyde complex, cobalt-salicylideneamine complex, cobalt-porphyrin complex, cobalt-thiourea complex, and the like.

Examples of the organic sulfonic acid metal salts include potassium diphenylsulfone-3-sulfonate, and the like.

When the organic metal salt-based flame retardant is combined, the amount of the retardant mixed is appropriately selected according to the type of the organic metal salt-based flame retardant, the other components of the epoxy resin composition, and the desired degree of flame retardancy. For example, the flame retardant is preferably mixed in a range of 0.005 to 10 parts by mass in 100 parts by mass of the epoxy resin composition containing all of the epoxy resin, the curing agent, the non-halogen flame retardant, and other filler and additives.

Any one of known various curing accelerators can be combined as long as it does not impair the effect of the present invention. Examples of the curing accelerator include a phosphorus-based compound, a tertiary amine, imidazole, an organic acid metal salt, a Lewis acid, an amine complex salt, and the like. Among these, from the viewpoint of excellent curability, heat resistance, electric characteristics, moisture-resistance reliability, etc., dimethylaminopyridine, imidazole, triphenylphosphine, 1,8-diazabicyclo-[5.4.0]-undecene (DBU), and benzyldimethylamine are particularly preferred.

When the curing accelerator is combined, the ratio of the curing accelerator used is preferably 0.1 to 2 parts by mass in 100 parts by mass of the epoxy resin composition.

Examples of other additives include a coupling agent such as γ-glycidoxypropyl trimethoxysilane, a colorant such as carbon black, a low-stress component such as silicone oil or silicone rubber, natural wax, synthetic wax, higher fatty acids or metal salts thereof, a mold releasing agent such as paraffin, an antioxidant, and the like. The contents of the additives have no particular problem as long as the amounts do not impair the desired performance of a cured product produced by curing the epoxy resin composition of the present invention.

The epoxy resin composition of the present invention can be produced by uniformly mixing, with a mixer, compounding components (excluding a coupling agent) containing the epoxy resin and the curing agent as essential components, and any desired components such as an inorganic filler etc., then, if required, adding a coupling agent, and then kneading the mixture using a heating roll, a kneader, or the like. The order of mixing of these components is not particularly limited except the timing of addition of the coupling agent. Further, after kneading, the melt kneaded material can be powdered or tabletted by grinding.

Since a cured product of the epoxy resin composition of the present invention has excellent thermal conductivity, substrate adhesion, and flexibility, the epoxy resin composition can be preferably used for applications to various electronic materials. In particular, in the use for applications to a power semiconductor and a heat-dissipating member of a power device or a power semiconductor, high performance is exhibited as compared with usual epoxy resin compositions. Besides these, the epoxy resin composition of the present invention can be used for a semiconductor encapsulating material, a printed circuit board, a build-up film, an insulating adhesive, a conductive paste and a conductive adhesive using a mixture with a conductive filler, and other various applications such as a matrix for composite materials, a photoresist material, a coating material, a color developing material, etc.

A heat-dissipating member for a power device is, for example, a member for connecting a semiconductor device and a heat sink member. In this case, a heat-dissipating resin material may mainly contain the epoxy resin of the present invention, a curing agent, and other additives, or may further contain an inorganic filler for further enhancing the heat dissipation effect. Alternatively, a multi-layer structure including a heat-dissipating layer containing an inorganic filler and an adhesive layer for securing adhesion to a metal substrate may be formed. In this case, the epoxy resin of the present invention can be preferably used for any one of the heat-dissipating layer and the adhesive layer because the epoxy resin is excellent in both thermal conductivity and substrate adhesion.

In this case, boron nitride, aluminum oxide, aluminum nitride, and the like, which have more excellent heat dissipation effect, can be used as the inorganic filler. The amount of the inorganic filler filling in the heat-dissipating resin material is preferably in a range of 20% to 95% by mass because of the high heat dissipation effect and excellent moldability and substrate adhesion. The heat-dissipating resin material may be applied directly to a surface of a substrate to form a film, or the heat-dissipating resin material may be formed into a sheet and then used. The film of the heat-dissipating member having a thickness of about 10 to 400 μm has excellent balance between insulation and heat-dissipation effect.

A semiconductor encapsulating material is produced from the epoxy resin composition of the present invention by a method of sufficiently melt-mixing compounding agents, such as an inorganic filler, with the epoxy composition containing the epoxy resin represented by the general formula (I) and the curing agent until the resultant mixture becomes uniform, if required, using an extruder, a kneader, a roll, or the like. In this case, the inorganic filler is mixed at a ratio of 70% to 95% by mass in the thermosetting resin composition, thereby producing a semiconductor encapsulating material of the present invention. In order to mold a semiconductor package, there is a method in which the composition is molded by casting or using a transfer molding machine or injection molding machine and then heated at 50 to 200° C. for 2 to 10 hours, thereby producing a semiconductor device as a molded product.

When the epoxy resin composition of the present invention is combined with a fibrous substrate such as glass fibers or the like and used as a composite material, for example, the epoxy resin composition containing the epoxy resin and the curing agent as main components is dissolved in an organic solvent, the sheet-shaped fibrous substrate is impregnated with the resultant solution, and the epoxy resin is partially reacted by heat-drying to produce a prepreg.

In order to produce a cured molded product using the epoxy resin composition of the present invention, for example, a heat molding method such as transfer molding, press molding, cast molding, injection molding, extrusion molding, or the like is used, but transfer molding is preferred from the viewpoint of productivity.

Even when both the epoxy resin and the curing agent in the epoxy resin composition of the present invention are composed of only a difunctional component, hydroxyl groups produced by reaction between the epoxy resin and the curing agent through heating reaction further partially react with epoxy groups in the epoxy resin, thereby generally producing a three-dimensional cured product. However, in some cases, a thermoplastic molded product substantially composed of only a two-dimensional polymer can be produced by using an organic solvent, selecting the type of the curing accelerator used, and controlling heating reaction conditions such as the reaction temperature.

A method for producing a printed circuit board from the epoxy resin composition of the present invention includes mixing an organic solvent with the epoxy resin composition containing the epoxy resin represented by the general formula (I) and the curing agent to form a varnish of the resin composition, impregnating a reinforcement substrate with the varnish, and then heat-pressure bonding a copper foil laminated thereon. Examples of the reinforcement substrate which can be used include paper, a glass cloth, a glass nonwoven fabric, aramid paper, an aramid cloth, a glass mat, a glass roving cloth, and the like. In further detail, the method includes first heating the varnish of the curable resin composition at a heating temperature, preferably 50° C. to 170° C., according to the type of the solvent used, to form a prepreg as a cured product. The mass ratio between the resin composition and the reinforcement substrate used is not particularly limited but is preferably adjusted so that the resin content in the prepreg is 20 to 60% by mass. Then, the prepregs formed as described above are stacked by a usual method, and a copper foil is appropriately laminated thereon and heat-pressure bonded at 170 to 250° C. for 10 minutes to 3 hours under a pressure of 1 to 10 MPa, thereby producing the intended printed circuit board.

As a method for producing an interlayer insulating material for a build-up board from the epoxy resin composition of the present invention, for example, the epoxy resin composition appropriately containing rubber and filler is applied to a circuit board having a circuit formed thereon by a spray coating method, a curtain coating method, or the like, and then cured. Then, if required, predetermined through holes are formed, and then a surface is treated with a coarsening agent, washed with hot water to form projections and depressions, and then plated with a metal such as copper. As the plating method, electroless plating and electrolytic plating are preferred, and an oxidizer, an alkali, and an organic solvent can be used as the coarsening agent. Such an operation is successively repeated according to demand to alternately build up a resin insulating layer and a conductor layer of a predetermined circuit pattern, thereby producing a build-up board. However, the through holes are formed after the outermost resin insulating layer is formed. Also, a build-up substrate can be formed by pressure-bonding a copper foil with a resin, which is formed by semi-curing the resin composition on the copper foil, under heating at 170 to 250° C. on the circuit board having a circuit formed thereon, without the steps of forming a coarsened surface and of plating.

A method for producing an adhesive film for build up from the epoxy resin composition of the present invention is, for example, a method of applying the curable epoxy resin composition of the present invention on a substrate film to form a resin composition layer, thereby forming an adhesive film for a multilayer printed circuit board.

When the epoxy resin composition of the present invention is used for an adhesive film for build up, it is important for the adhesive film to soften at a lamination temperature condition (usually 70° C. to 140° C.) in a vacuum lamination method and to exhibit fluidity (resin flow) which permits resin filling in via holes or through holes present in the circuit board at the same time as lamination on the circuit board. Therefore, the above-described components are preferably mixed so as to exhibit these characteristics.

The through holes in the multilayer printed circuit board generally have a diameter of 0.1 to 0.5 mm and a depth of 0.1 to 1.2 mm, and can be filled with the resin within this range. When both surfaces of the circuit board are laminated, the through holes are preferably about ½ filled.

Specifically, the method for producing the adhesive film includes preparing the varnish-like epoxy resin composition of the present invention, applying the varnish-like composition on a surface of a substrate film (y), and further drying the organic solvent by heating or hot air spraying to form a curable resin composition layer (x).

The thickness of the layer (x) formed is generally not less than the thickness of a conductor layer. Since the thickness of the conductor layer provided in the circuit board is generally in the range of 5 to 70 μm, the thickness of the resin composition layer is preferably 10 to 100 μm.

Examples of the substrate film include films of polyolefins such as polyethylene, polypropylene, polyvinyl chloride, and the like, polyesters such as polyethylene terephthalate (may be abbreviated as "PET" hereinafter), polyethylene naphthalate, and the like, polycarbonate, polyimide, release paper, and metal foils such as a copper foil, an aluminum foil, and the like. A support film and a protecting film may be subjected to MAD treatment, corona treatment, or release treatment.

The thickness of the substrate film is not particularly limited, but is generally 10 to 150 μm and preferably in a range of 25 to 50 μm. The thickness of the protecting film is preferably 1 to 40 μm.

The substrate film (y) is separated after being laminated on the circuit board or after the insulating film is formed by heat curing. When the substrate film (y) is separated after the adhesive film is heat-cured, adhesion of dust in the curing step can be prevented. When the substrate film is separated after curing, generally, the support film is previously subjected to release treatment.

Next, in the method for producing the multilayer printed circuit board using the adhesive film formed as described above, for example, when the layer (x) is protected by the protecting film, the protecting film is separated, and then the layer (x) is laminated on one or both surfaces of the circuit board by, for example, a vacuum lamination method so that the layer is in direct contact with the circuit board. The lamination method may be a butch mode or a continuous mode using a roll. In addition, if required, the adhesive film and the circuit board may be heated (preheated) before the lamination.

The lamination is preferably performed under the lamination conditions including a pressure-bonding temperature (lamination temperature) of 70° C. to 140° C. and a pressure-bonding pressure of 1 to 11 kgf/cm2 (9.8×104 to 107.9×104 N/m2), and under reduced air pressure of 20 mmHg (26.7 hPa) or less.

EXAMPLES

The present invention is described in further detail below with reference to examples, but the present invention is not limited to the scope of these examples. In the examples, "parts", "%", and a "ratio" are all on a mass basis unless otherwise specified. In addition, GPC, $^{13}$C-NMR, and MS were measured under conditions described below.

1) GPC: Measurement Conditions are as Follows.

Measurement apparatus: "HLC-8220 GPC" manufactured by Tosoh Corporation

Column: Guard Column "HXL-L" manufactured by Tosoh Corporation
  "TSK-GEL G2000HXL" manufactured by Tosoh Corporation
  "TSK-GEL G2000HXL" manufactured by Tosoh Corporation
  "TSK-GEL G3000HXL" manufactured by Tosoh Corporation
  "TSK-GEL G4000HXL" manufactured by Tosoh Corporation Detector: RI (differential refractometer)

Data processing: "GPC-8020 model II version 4.10" manufactured by Tosoh Corporation Measurement conditions:
Column temperature 40° C.
Developing solvent tetrahydrofuran
Flow rate 1.0 ml/min
Standard: using monodisperse polystyrene described below having a known molecular weight according to a measurement manual of the "GPC-8020 model II version 4.10".

(Polystyrene used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: prepared by filtering, with a microfilter, a tetrahydrofuran solution of 1.0% by mass in terms of resin solid content (50 µl).

2) $^{13}$C-NMR: The Measurement Conditions are as Follows.

Apparatus: AL-400 manufactured by JEOL, Ltd.
Measurement mode: SGNNE (NOE-suppressed 1H complete decoupling method)
Solvent: dimethylsulfoxide
Pulse angle: 45° C. pulse
Sample concentration: 30 wt %
Number of acquisitions: 10000

3) MS spectrum: double focusing mass spectrometer AX505H (FD505H) manufactured by JEOL, Ltd.

Example 1

In a flask provided with a thermometer, a cooling tube, a fractionating column, and a stirrer, 186 parts by mass (1 mole) of biphenol and 488 parts by mass (2 moles) of 1,6-hexanediol diglycidyl ether (SR-16HL manufactured by Sakamoto Yakuhin Kogyo Co., Ltd., epoxy equivalent 122 g/eq) were charged and stirred at 150° C. under nitrogen blowing, thereby preparing a solution. Then, 1.0 g of tetramethylammonium chloride was added as an aqueous solution to the resultant solution, and the resultant mixture was stirred at 150° C. for 4 hours to produce 650 parts by mass of epoxy resin (A-1) having an epoxy equivalent of 395 g/eq.

Figure 2:
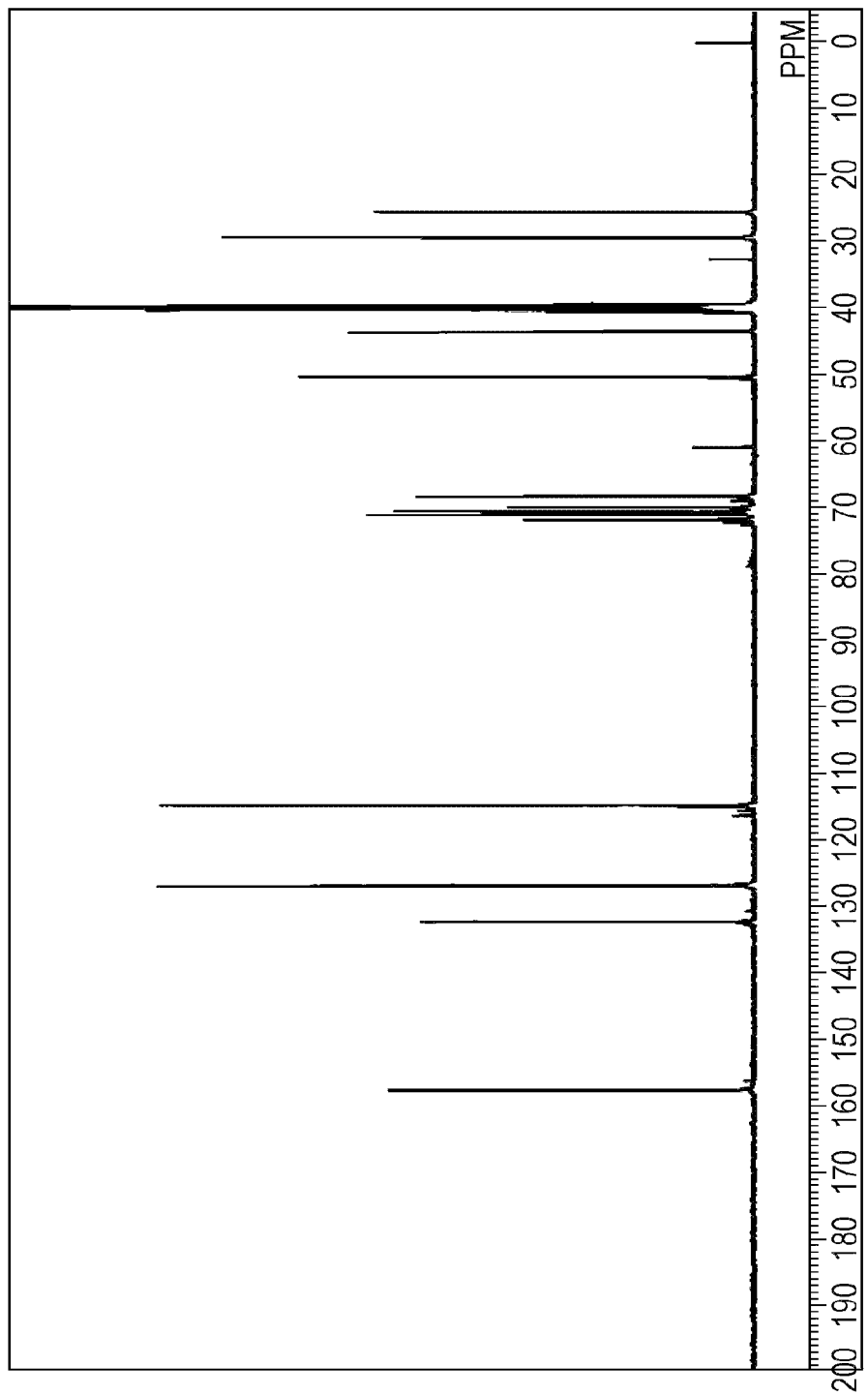
FIG. 2 is a C$^{13}$NMR chart of epoxy resin (A-1) produced in Example 1.
Figure 3:
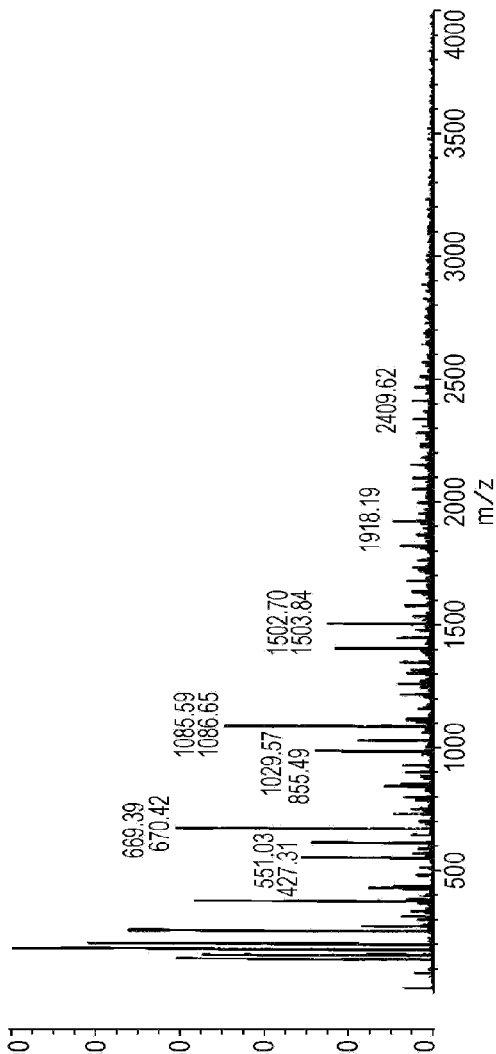
FIG. 3 is a MS spectrum of epoxy resin (A-1) produced in Example 1.

FIG. 1 shows a GPC chart of the epoxy resin (A-1), FIG. 2 shows a $^{13}$C-NMR chart, and FIG. 3 shows a MS spectrum. In the MS spectrum, peaks (m/z=669 (n=0), m/z=1085 (n=1)) of a target product represented by a structural formula below were detected.

[Chem. 18]

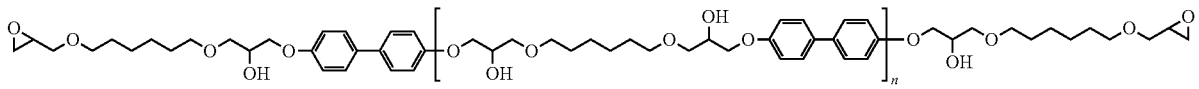

Example 2

By using the same method as in Example 1 except that 186 parts by mass (1 mole) of biphenol in Example 1 was changed to 160 parts by mass (1 mole) of 2,6-dihydroxynaphthalene, 648 parts by mass of epoxy resin (A-2) having an epoxy equivalent of 358 g/eq was produced.

Figure 4:
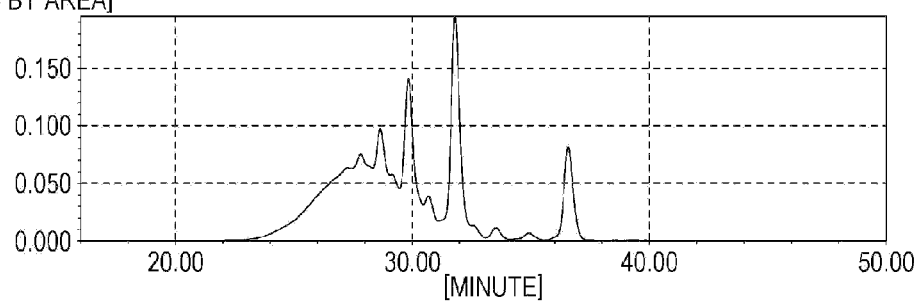
FIG. 4 is a GPC chart of epoxy resin (A-2) produced in Example 2.
Figure 5:
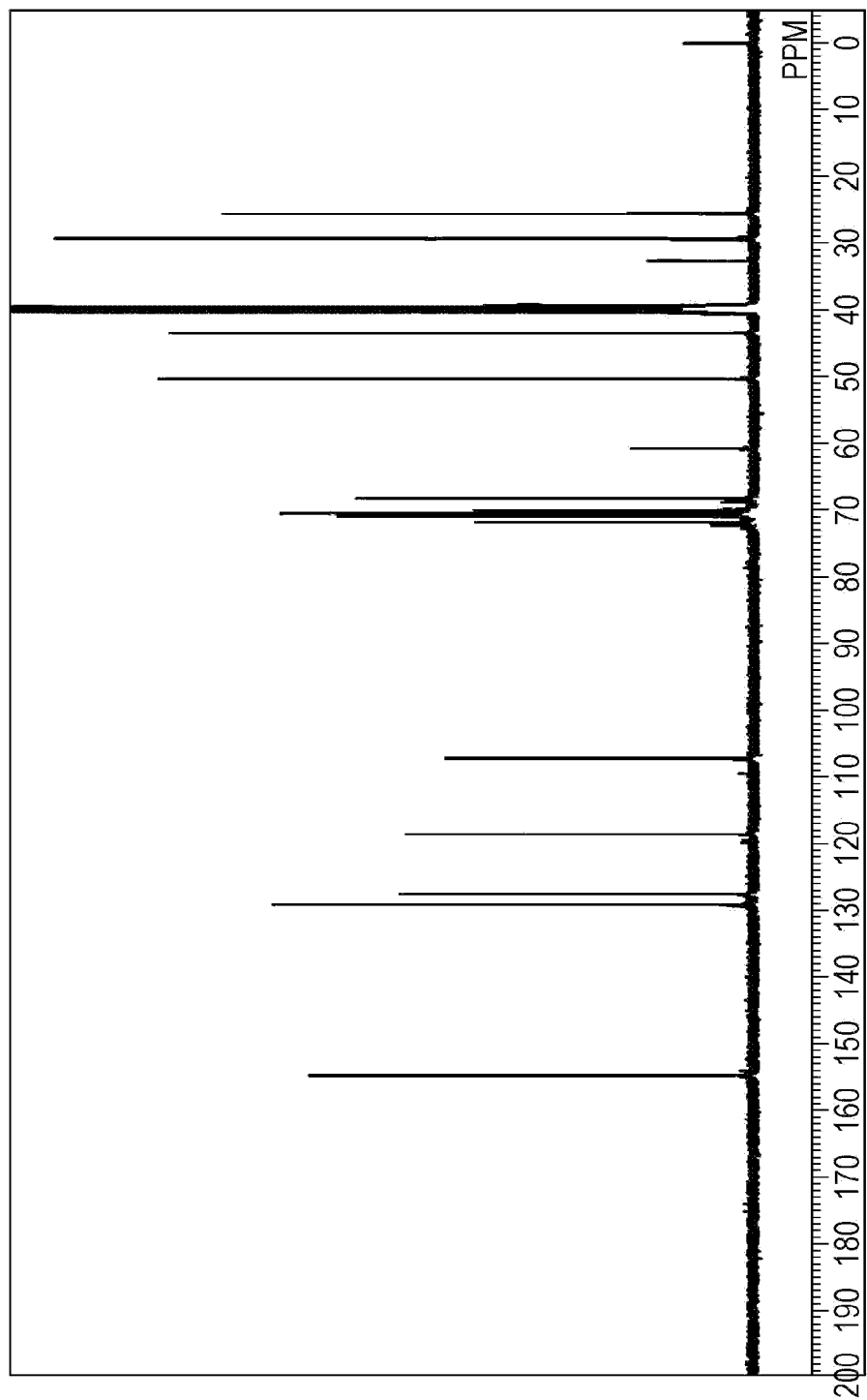
FIG. 5 is a C$^{13}$NMR chart of epoxy resin (A-2) produced in Example 2.
Figure 6:
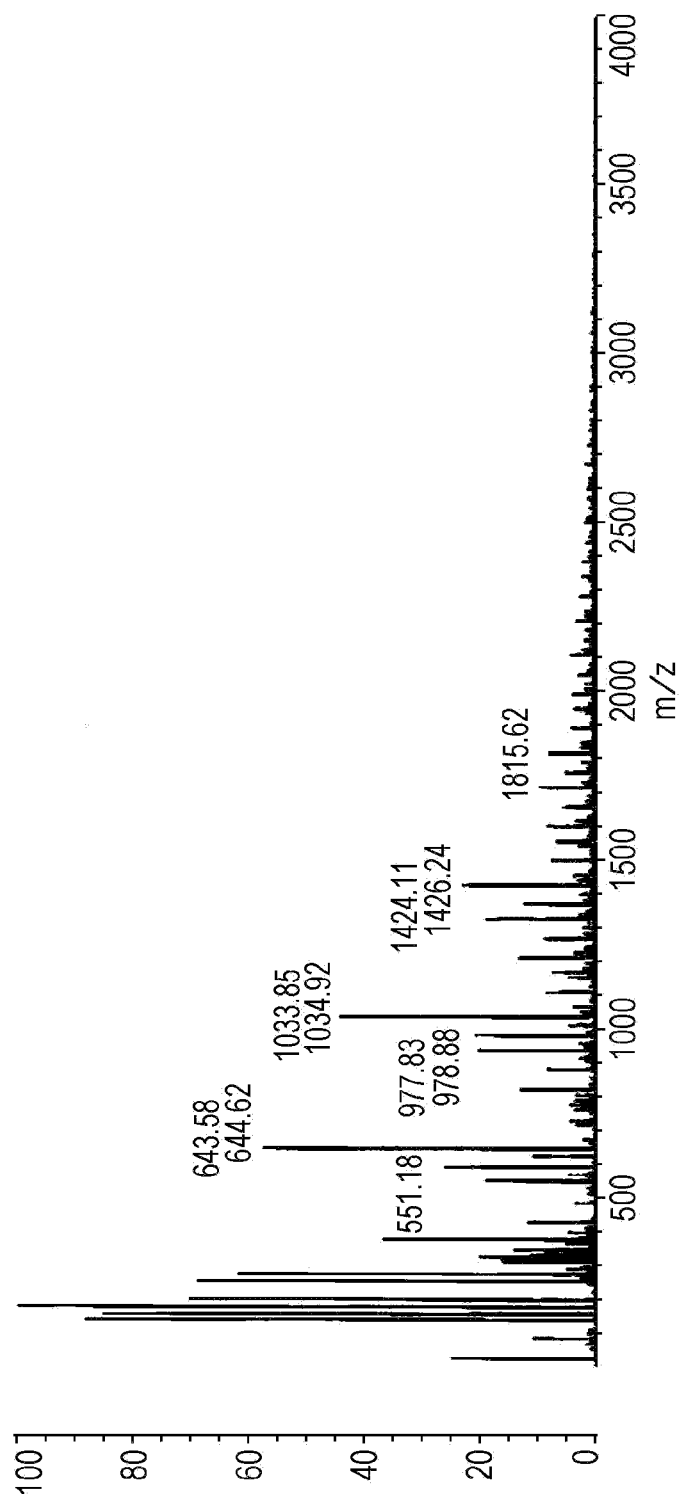
FIG. 6 is a MS spectrum of epoxy resin (A-2) produced in Example 2.

FIG. 4 shows a GPC chart of the epoxy resin (A-2), FIG. 5 shows a $^{13}$C-NMR chart, and FIG. 6 shows a MS spectrum. In the MS spectrum, peaks (m/z=643 (n=0), m/z=1034 (n=1)) of a target product represented by a structural formula below were detected.

[Chem. 19]

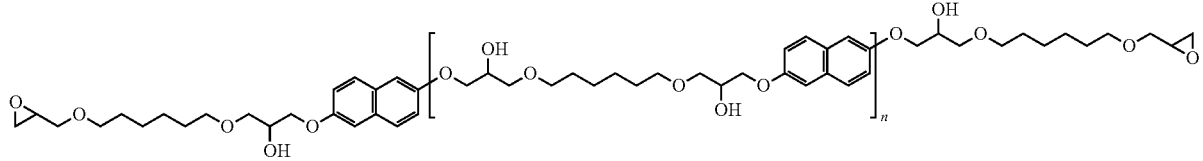

Example 3

By using the same method as in Example 1 except that 186 parts by mass (1 mole) of biphenol in Example 1 was changed to 202 parts by mass (1 mole) of 4,4'-dihydroxydiphenyl ether, 690 parts by mass of epoxy resin (A-3) having an epoxy equivalent of 365 g/eq was produced.

Figure 7:
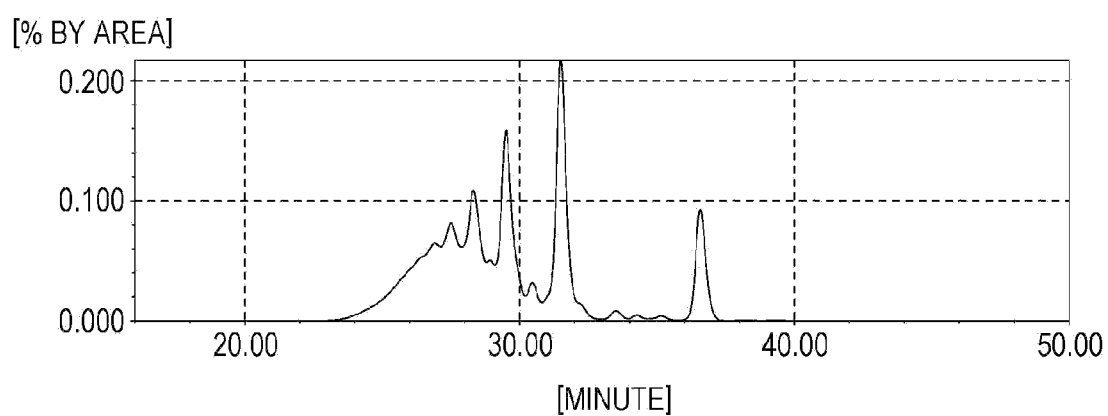
FIG. 7 is a GPC chart of epoxy resin (A-3) produced in Example 3.
Figure 8:
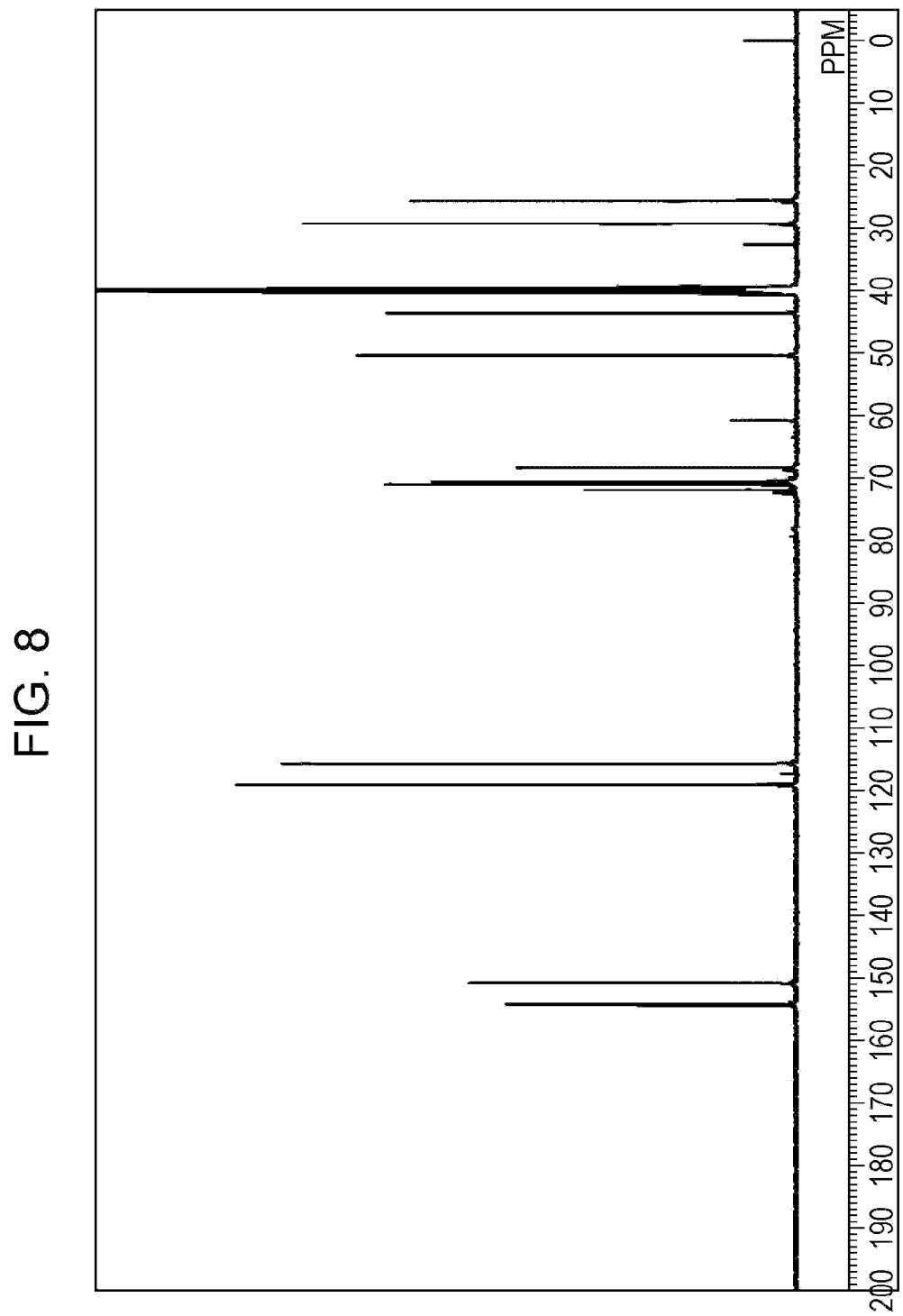
FIG. 8 is a C$^{13}$NMR chart of epoxy resin (A-3) produced in Example 3.
Figure 9:
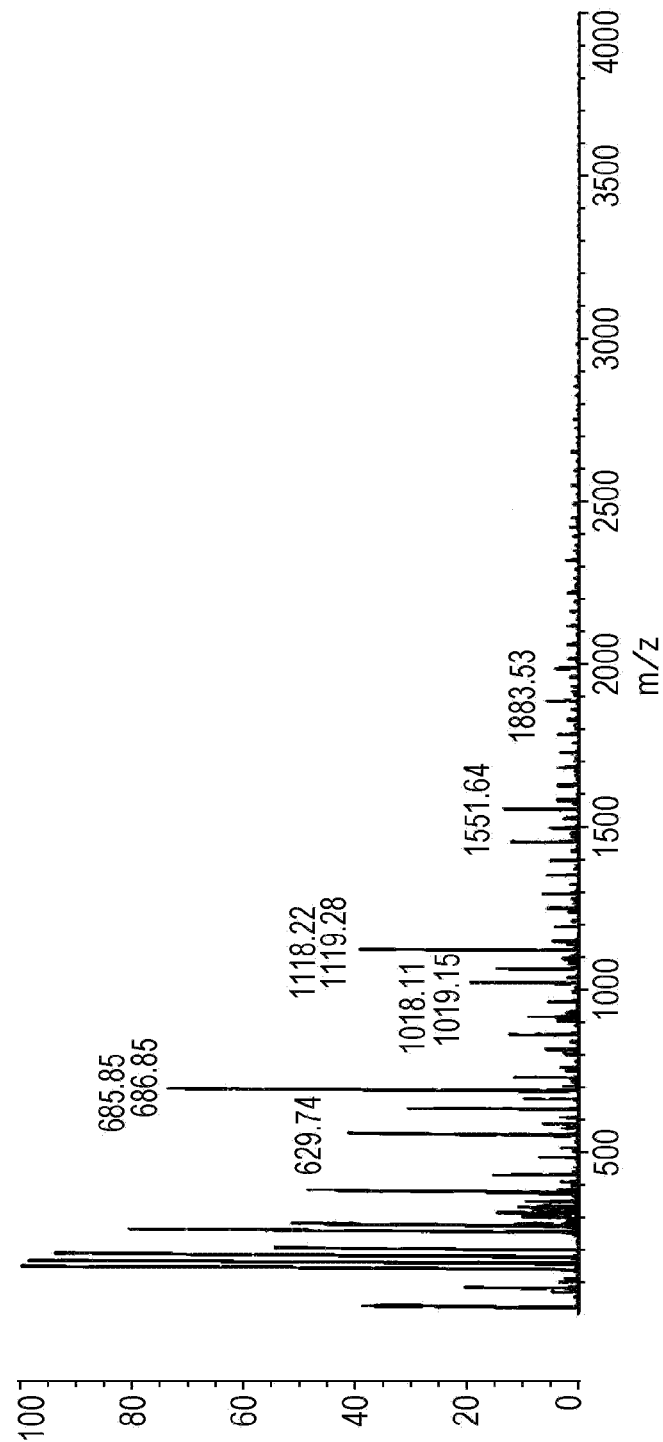
FIG. 9 is a MS spectrum of epoxy resin (A-3) produced in Example 3.

FIG. 7 shows a GPC chart of the epoxy resin (A-3), FIG. 8 shows a $^{13}$C-NMR chart, and FIG. 9 shows a MS spectrum. In the MS spectrum, peaks (m/z=686 (n=0), m/z=1118 (n=1)) of a target product represented by a structural formula below were detected.

[Chem. 20]

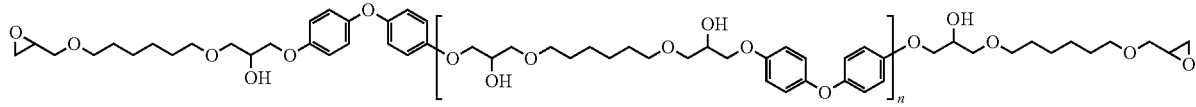

Example 4

By using the same method as in Example 1 except that 186 parts by mass (1 mole) of biphenol in Example 1 was changed to 214 parts by mass (1 mole) of 4,4'-dihydroxybenzophenone, 702 parts by mass of epoxy resin (A-4) having an epoxy equivalent of 560 g/eq was produced.

Figure 10:
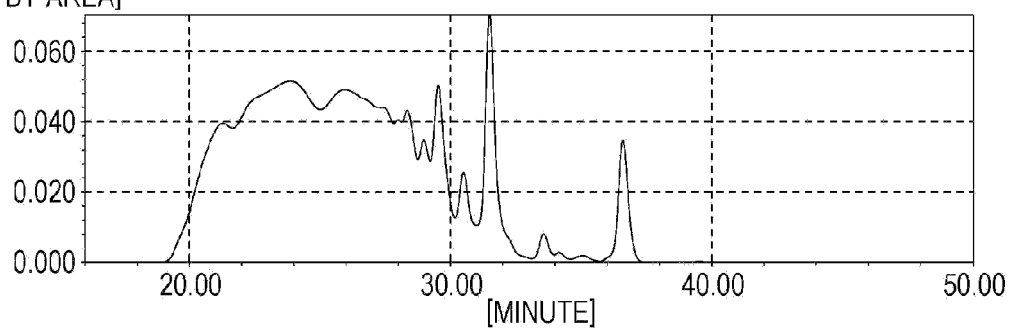
FIG. 10 is a GPC chart of epoxy resin (A-4) produced in Example 4.
Figure 11:
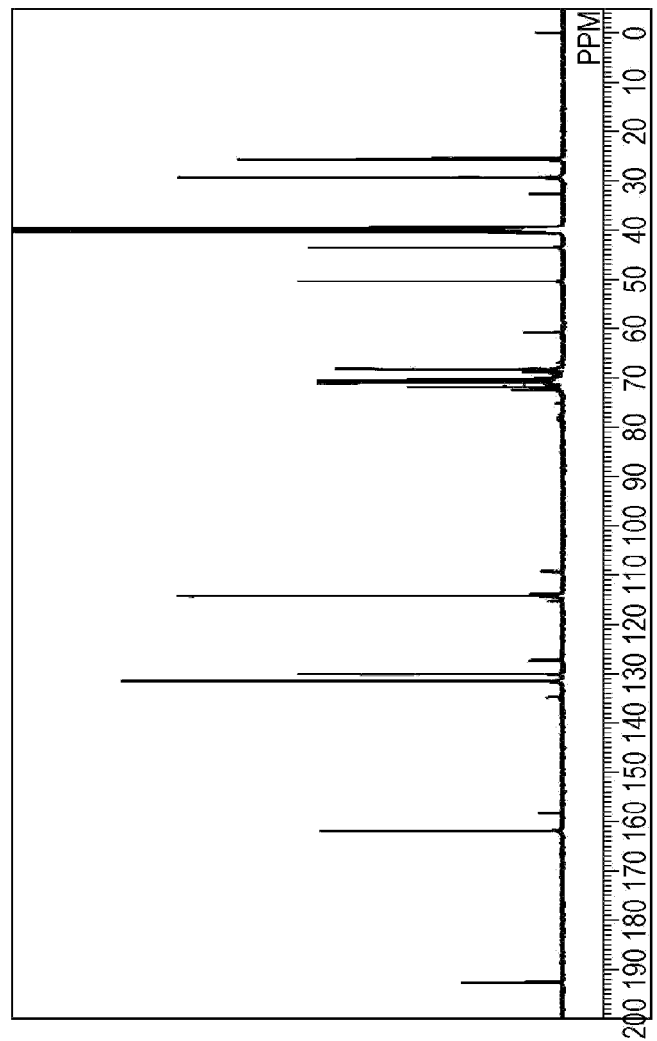
FIG. 11 is a C$^{13}$NMR chart of epoxy resin (A-4) produced in Example 4.
Figure 12:
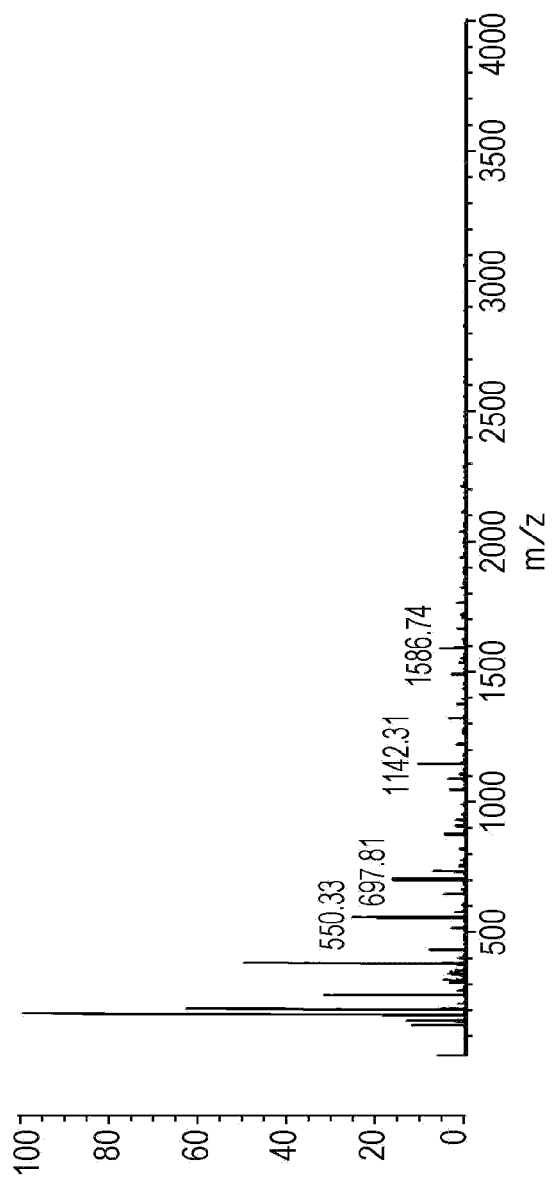
FIG. 12 is a MS spectrum of epoxy resin (A-4) produced in Example 4.

FIG. 10 shows a GPC chart of the epoxy resin (A-4), FIG. 11 shows a $^{13}$C-NMR chart, and FIG. 12 shows a MS spectrum. In the MS spectrum, peaks (m/z=698 (n=0), m/z=1142 (n=1)) of a target product represented by a structural formula below were detected.

[Chem. 21]

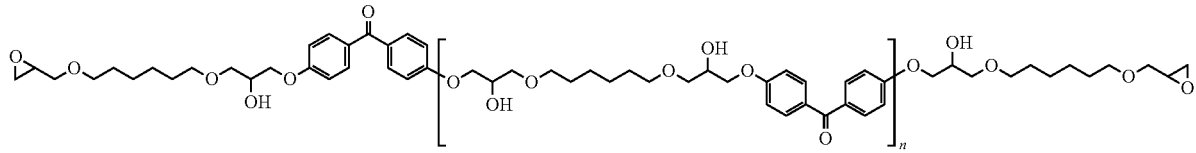

Example 5

By using the same method as in Example 1 except that 1,6-hexanediol diglycidyl ether in Example 1 was changed to 492 parts by mass (2 moles) of diethylene glycol diglycidyl ether (EX-850 manufactured by Nagase Chemtex Corporation, epoxy equivalent 123 g/eq), 652 parts by mass of epoxy resin (A-5) having an epoxy equivalent of 394 g/eq was produced.

Example 6

By using the same method as in Example 1 except that 1,6-hexanediol diglycidyl ether in Example 1 was changed to 436 parts by mass (2 moles) of 1,4-butanediol diglycidyl ether (EX-214L manufactured by Nagase Chemtex Corporation, epoxy equivalent 109 g/eq), 622 parts by mass of epoxy resin (A-6) having an epoxy equivalent of 367 g/eq was produced.

Comparative Synthesis Example 1

In a flask provided with a thermometer, a cooling tube, a fractionating column, and a stirrer, 200 parts by mass of 99% methanol, 186 parts by mass (1 mole) of biphenol, and 362 parts by mass (2 moles) of 6-bromo-hexan-1-ol were charged and stirred at 75° C. under nitrogen blowing to prepare a solution. Next, 200 parts by mass of a 99% ethanol solution prepared by dissolving 130 parts by mass (2 moles) of 86% potassium hydroxide was added to the resultant solution over 30 minutes, followed by heating under reflux and stirring for 4 hours. The reaction mixture was cooled to room temperature, and then the reaction solution was neutralized with 30% sulfuric acid, filtered, washed with water, and then dried to produce white crystals.

Next, in a flask provided with a thermometer, a cooling tube, a fractionating column, and a stirrer, the white crystals produced as described above, 462 parts by mass of epichlorohydrin, and 231 parts by mass of dimethylsulfoxide were charged, and the internal pressure was reduced to about 6 kPa. Then, 233 parts by mass of 48% potassium hydroxide was added dropwise under reflux at 50° C. over 60 minutes. During reaction, water was removed to the outside the system by distillation. Then, 48% potassium hydroxide was added dropwise to the reaction mixture, and the temperature was increased to 70° C., followed by further reaction under reflux for 1 hour at the same temperature.

After the completion of the reaction, 400 parts by mass of methyl isobutyl ketone and 450 parts by mass of water were added to the reaction mixture, and a by-product aqueous potassium chloride solution was discarded. Then, dimethylsulfoxide was removed by washing with 400 parts by mass of water, and then the temperature was increased to 150° C. to recover epichlorohydrin by distillation under reduced pressure, thereby producing 470 parts by mass of epoxy resin (B-1) having an epoxy equivalent of 300 g/eq.

Comparative Synthesis Example 2

By using the same method as in Comparative Synthesis Example 1 except that 186 parts by mass (1 mole) of biphenol in Comparative Synthesis Example 1 was changed to 202 parts by mass (1 mole) of 4,4'-dihydroxydiphenyl ether, 475 parts by mass of epoxy resin (B-2) having an epoxy equivalent of 305 g/eq was produced.

Comparative Synthesis Example 3

In a flask provided with a thermometer, a cooling tube, a fractionating column, and a stirrer, 202 parts by mass of 4,4'-dihydroxydiphenyl ether, 462 parts by mass of epichlorohydrin, and 231 parts by mass of dimethylsulfoxide were charged, and the internal pressure was reduced to about 6 kPa. Then, 233 parts by mass of 48% potassium hydroxide was added dropwise under reflux at 50° C. over 60 minutes. During reaction, water was removed to the outside of the system by distillation. Then, 48% potassium hydroxide was added dropwise to the reaction mixture, and the temperature was increased to 70° C., followed by further reaction under reflux for 1 hour at the same temperature. After the completion of the reaction, 400 parts by mass of methyl isobutyl ketone and 450 parts by mass of water were added to the reaction mixture, and a by-product aqueous potassium chloride solution was discarded. Then, dimethylsulfoxide was removed by washing with 400 parts by mass of water, and then the temperature was increased to 150° C. to recover epichlorohydrin by distillation under reduced pressure, thereby producing 304 parts by mass of epoxy resin (B-3) having an epoxy equivalent of 188 g/eq.

Examples 7 to 12 and Comparative Examples 1 to 4

Preparation and Physical Property Evaluation of Epoxy Resin Composition

[Condition for Forming Cured Product for Thermal Conductivity Test]

According to compositions shown in Table 1 and Table 2 below, phenol novolac resin "TD-2131" manufactured by DIC Corporation was mixed as a curing agent, and further 2-ethyl-4-methylimidazole (2E4MZ) serving as a curing catalyst and 400 parts of spherical alumina (average particle diameter 12.2 μm) serving as an inorganic filler were added.

Compounding Condition:

The components were sufficiently mixed with a mixer and then kneaded at 100° C. for 5 minutes, cooled, and then ground.

Curing condition: 1 hour at 150° C. and further 6 hours at 175° C.

Thickness after molding: 1.2 mm, resin amount 20%

A cured product formed under the conditions described above was used as a specimen and evaluated for thermal conductivity. The results are summarized in Table 1 and Table 2.

[Condition for Forming Cured Product for Thermal Decomposition Resistance Test]

According to compositions shown in Table 1 and Table 2 below, phenol novolac resin "TD-2131" manufactured by DIC Corporation was mixed as a curing agent, and further 2-ethyl-4-methylimidazole (2E4MZ) serving as a curing catalyst was added.

Compounding Condition:

The components were sufficiently mixed with a mixer and then kneaded at 100° C. for 5 minutes, cooled, and then ground.

Curing condition: 1 hour at 150° C. and further 6 hours at 175° C.

Thickness after molding: 0.2 mm, resin amount 100%

A cured product formed under the conditions described above was used as a specimen and evaluated for thermal decomposition resistance. The results are summarized in Table 1 and Table 2.

[Condition for Forming Laminate for Soldering Resistance Test, Flexibility Test, and Adhesion Test]

According to compositions shown in Table 1 and Table 2 below, phenol novolac resin "TD-2131" manufactured by DIC Corporation was mixed as a curing agent, and further 2-ethyl-4-methylimidazole (2E4MZ) serving as a curing catalyst was added. Finally, methyl ethyl ketone was mixed so that the nonvolatile content (N. V.) of each of the compositions was 58% by mass.

Substrate: 100-μm glass cloth for printed circuit board "2116" manufactured by Nitto Boseki Co., Ltd.

Number of plies: 6

Copper foil: 18-μm TCR foil manufactured by Nippon Mining & Metals Co., Ltd.

Prepregnating condition: 160° C./2 minutes

Curing condition: 200° C., 2.9 MPa, 2 hours

Thickness after molding: 0.8 mm, resin amount 40%

A cured product formed under the conditions described above was used as a specimen and evaluated for each of items described below. The results are summarized in Table 1 and Table 2.

[Thermal Conductivity]

Measured by a transient hot wire method using thermal conductivity meter QTM-500 manufactured by Kyoto Electronics Manufacturing Co., Ltd.

[Thermal Decomposition Temperature]

A specimen was maintained at 150° C. for 15 minutes, and then a 5% mass reduction temperature of a sample amount of 6 mg was determined at a heating rate of 5° C./min in an atmosphere of nitrogen gas flow.

[Soldering Resistance Test]

Three specimens of each of the examples and the comparative examples were prepared, allowed to stand for 6 hours in a pressure cooker of 121° C., and then dipped in a soldering bath of 288° C. for 30 seconds to visually observe the presence of bulging. The specimen without bulging was evaluated as "good", and the specimen with bulging was evaluated as "poor".

[Three-Point Bending Elongation]

A specimen was cut into a size of 25 mm×75 mm, and an elongation percentage was determined by measurement using "AUTOGRAPH AG-1" manufactured by Shimadzu Corporation according to JIS K6911.

[Peel Strength]

According to JIS-K6481.

[Interlayer Peel Strength]

According to JIS-K6481.

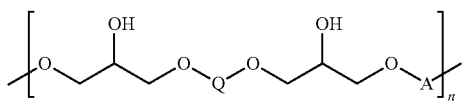

TABLE 1

| Table 1 | | Example 7 | Example 8 | Example 9 | Example 10 | Example 11 | Example 12 |
|---|---|---|---|---|---|---|---|
| Epoxy resin | A-1 | 79 | | | | | |
| | A-2 | | 77 | | | | |
| | A-3 | | | 78 | | | |
| | A-4 | | | | 84 | | |
| | A-5 | | | | | 79 | |
| | A-6 | | | | | | 78 |
| Curing agent | TD-2131 | 21 | 23 | 22 | 16 | 21 | 22 |
| Catalyst | 2E4MZ | 0.2 | 0.2 | 0.2 | 0.2 | 0.2 | 0.2 |
| Thermal conductivity | Thermal conductivity [W/(m·K)] | 5.3 | 5.7 | 6.0 | 5.0 | 4.0 | 4.5 |
| Resistance to thermal decomposition | 5% mass reduction temperature [°C] | 369 | 369 | 371 | 375 | 340 | 369 |
| Heat resistance | Soldering resistance | Good | Good | Good | Good | Good | Good |
| Flexibility | Three-point bending elongation [%] | 20 | 22 | 25 | 18 | 11 | 10 |
| Adhesion | Copper foil peel strength [KN/m] | 2.0 | 1.8 | 2.2 | 2.0 | 1.2 | 1.5 |
| | Interlayer peel strength [KN/m] | 2.0 | 2.0 | 2.2 | 1.8 | 1.0 | 1.0 |

TABLE 2

| | | Comparative Example 1 | Comparative Example 2 | Comparative Example 3 | Comparative Example 4 |
|---|---|---|---|---|---|
| Epoxy resin | B-1 | 74 | | | |
| | B-2 | | 75 | | |
| | B-3 | | | 64 | |
| | YX-6121 | | | | 63 |
| Curing agent | TD-2131 | 26 | 25 | 36 | 37 |
| Catalyst | 2E4MZ | 0.2 | 0.2 | 0.2 | 0.2 |
| Thermal conductivity | Thermal conductivity [W/(m·K)] | 3.5 | 3.5 | 2.1 | 1.9 |
| Resistance to thermal decomposition | 5% mass reduction temperature [°C] | 310 | 300 | 369 | 369 |
| Heat resistance | Soldering resistance | Poor | Poor | Good | Good |
| Flexibility | Three-point bending elongation [%] | 15 | 14 | 3 | 2 |
| Adhesion | Copper foil peel strength [KN/m] | 1.1 | 0.8 | 1.1 | 1.1 |
| | Interlayer peel strength [KN/m] | 0.5 | 0.5 | 0.5 | 0.5 |

In Table 2, YX-6121 denotes a biphenol-type epoxy resin (epoxy equivalent 180 g/eq) manufactured by Mitsubishi Chemical Corporation.

The invention claimed is:

1. An epoxy resin represented by general formula (I) below,

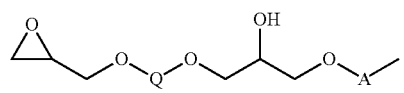

(I)

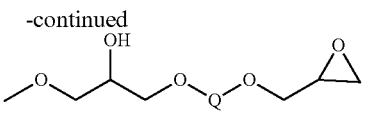

wherein, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

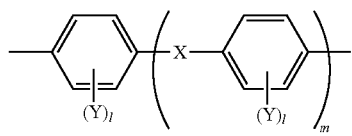

wherein, Y each independently represent a halogen atom, a hydrocarbon group having 1 to 8 carbon atoms, or an alkoxyl group having 1 to 8 carbon atoms; X represents a single bond, a —O— group, a —CH=CH— group, a —CH=C(CH$_3$)— group, a —CH=C(CN)— group, a —C≡C— group, a —CH=N— group, a —CH=CH—CO— group, a —N=N— group, a —COO— group, a —CONH— group, or a —CO— group; l each independently represent an integer of 0 to 4; and m represents an integer of 1 to 3; and n, represents an integer of 0 to 10.

2. The epoxy resin according to claim 1, wherein in the general formula (I), A each independently represent a structural site represented by any one of general formulae (i-1) to (i-3) below, and Q each independently represent a linear alkylene chain having 3 to 7 carbon atoms or ethyleneoxyethylene

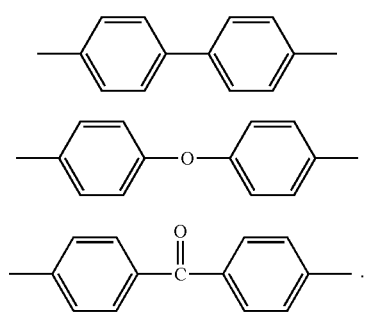

3. A method for producing the epoxy resin according to claim 1, wherein the method comprising reacting a diol compound (a) with at least one diglycidyl ether compound (q), the diol compound (a) being represented by general formula (1),

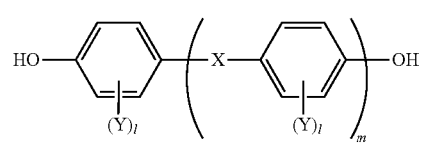

wherein, Y each independently represent a halogen atom, a hydrocarbon group having 1 to 8 carbon atoms, or an alkoxyl group having 1 to 8 carbon atoms; X represents a single bond, a —O— group, a —CH=CH— group, a —CH=C(CH$_3$)— group, a —CH=C(CN)— group, a —C≡C— group, a —CH=N— group, a —CH=CH—CO— group, a —N=N— group, a —COO— group, a —CONH— group, or a —CO— group; l each independently represent an integer of 0 to 4; and m represents an integer of 1 to 3, and the at least one diglycidyl ether compound (q) being selected from the group consisting of a diglycidyl ether of a linear alkylene diol having 1 to 9 carbon atoms, a diglycidyl ether of a branched alkylene diol having a structure in which an alkyl group having 1 to 18 carbon atoms is bonded to a carbon atom of the linear alkylene diol, and a diglycidyl ether of a diol compound having an ether bond present between two continuous methylene groups in the alkylene diol.

4. The method for producing the epoxy resin according to claim 3, wherein the diol compound (a) is a diol compound represented by any one of general formulae (1-1) to (1-3) below, and the diglycidyl ether compound (q) is a diglycidyl ether of a linear alkylene diol having 2 to 7 carbon atoms or diethylene glycol

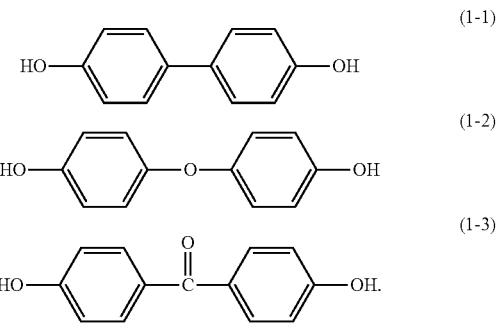

5. An epoxy resin composition comprising an epoxy resin and a curing agent, the epoxy resin being represented by general formula (I) below,

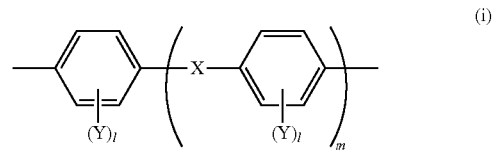

wherein, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below wherein, Y each independently represent a halogen atom, a hydrocarbon group having 1 to 8 carbon atoms, or an alkoxyl group having 1 to 8 carbon atoms; X represents a single bond, a —O— group, a —CH═CH— group, a —CH═C(CH₃)— group, a —CH═C(CN)— group, a —C≡C— group, a —CH═N— group, a —CH═CH—CO— group, a —N═N— group, a —COO— group, a —CONH— group, or a —CO— group; l each independently represent an integer of 0 to 4; and m represents an integer of 1 to 3 and n represents an integer of 0 to 10.

6. The epoxy resin composition according to claim 5, wherein in the general formula (I), A each independently represent a structural site represented by any one of general formulae (i-1) to (i-3) below, and Q each independently represent a linear alkylene chain having 3 to 7 carbon atoms or ethyleneoxyethylene

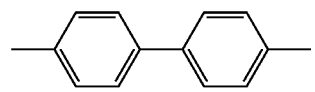
(i-1)

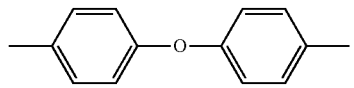
(i-2)

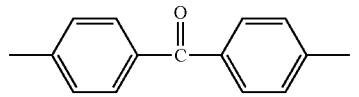
(i-3)

7. A cured product produced by curing the epoxy resin composition to claim 5.

8. A cured product produced by curing the epoxy resin composition to claim 6.

9. A heat-dissipating resin material comprising an epoxy resin, a curing agent, and an inorganic filler, the epoxy resin being represented by general formula (I) below, wherein, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

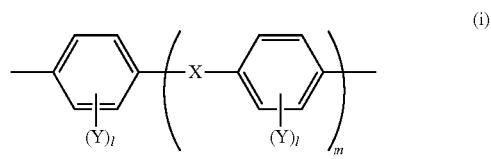
(i)

wherein, Y each independently represent a halogen atom, a hydrocarbon group having 1 to 8 carbon atoms, or an alkoxyl group having 1 to 8 carbon atoms; X represents a single bond, a —O— group, a —CH═CH— group, a —CH═C(CH₃)— group, a —CH═C(CN)— group, a —C≡C— group, a —CH═N— group, a —CH═CH—CO— group, a —N═N— group, a —COO— group, a —CONH— group, or a —CO— group; l each independently represent an integer of 0 to 4; and m represents an integer of 1 to 3; and n represents an integer of 0 to 10, wherein a ratio of the inorganic filler is within a range of 20% to 95% by mass.

10. The heat dissipating resin material according to claim 9, wherein in the general formula (I), A each independently represent a structural site represented by any one of general formulae (i-1) to (i-3) below, and Q each independently represent a linear alkylene chain having 3 to 7 carbon atoms or ethyleneoxyethylene

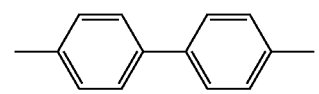
(i-1)

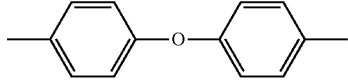
(i-2)

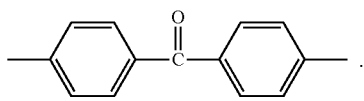
(i-3)

11. A semiconductor encapsulating material comprising an epoxy resin, a curing agent, and an inorganic filler, the epoxy resin being represented by general formula (I) below,

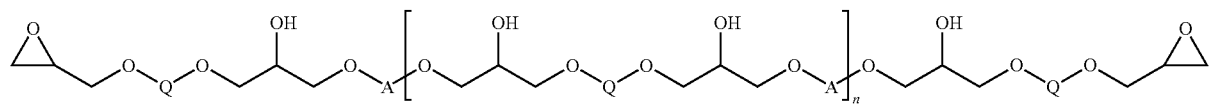
(I)

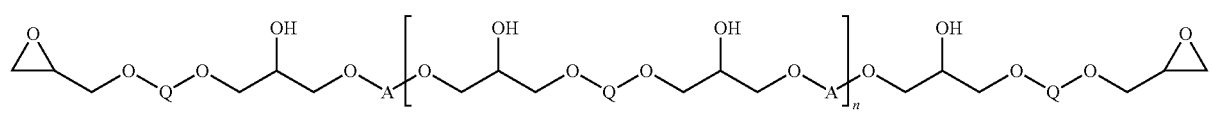

wherein, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

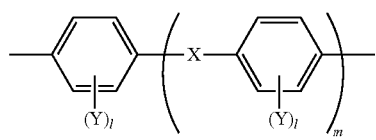

wherein, Y each independently represent a halogen atom, a hydrocarbon group having 1 to 8 carbon atoms, or an alkoxyl group having 1 to 8 carbon atoms; X represents a single bond, a —O— group, a —CH═CH— group, a —CH═C(CH$_3$)— group, a —CH═C(CN)— group, a —C≡C— group, a —CH═N— group, a —CH═CH—CO— group, a —N═N— group, a —COO— group, a —CONH— group, or a —CO— group; l each independently represent an integer of 0 to 4; and m represents an integer of 1 to 3; and n represents an integer of 0 to 10, wherein a ratio of the inorganic filler is within a range of 20% to 95% by mass.

12. The semiconductor encapsulating material according to claim 11, wherein in the general formula (I), A each independently represent a structural site represented by any one of general formulae (i-1) to (i 3) below, and Q each independently represent a linear alkylene chain having 3 to 7 carbon atoms or ethyleneoxyethylene

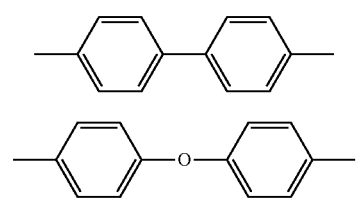

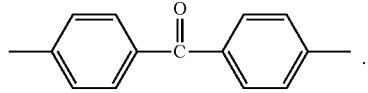

13. A circuit board produced by heat-pressure-molding a plate-shaped material and a copper foil laminated on a surface of the plate, the plate-shaped material being composed of a varnish containing an epoxy resin, a curing agent, and an organic solvent, and the epoxy resin being represented by general formula (I) below,

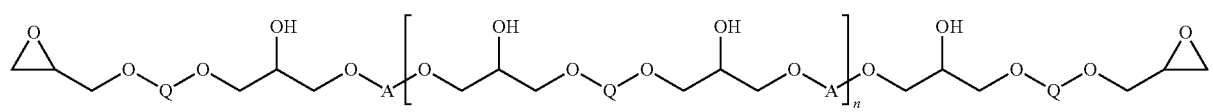

wherein, Q each independently represent a linear alkylene chain having 1 to 9 carbon atoms, a branched alkylene chain having a structure in which an alkyl group having 1 to 18 carbon atoms is bonded to a carbon atom of the linear alkylene chain, or a linkage chain having an ether bond present between two continuous methylene groups in the alkylene chain; A each independently represent a phenylene unit represented by general formula (i) below

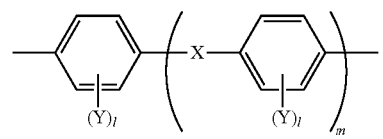

wherein, Y each independently represent a halogen atom, a hydrocarbon group having 1 to 8 carbon atoms, or an alkoxyl group having 1 to 8 carbon atoms; X represents a single bond, a —O— group, a —CH═CH— group, a —CH═C(CH$_3$)— group, a —CH═C(CN)— group, a —C≡C— group, a —CH═N— group, a —CH═CH—CO— group, a —N═N— group, a —COO— group, a —CONH— group, or a —CO— group; l each independently represent an integer of 0 to 4; and m represents an integer of 1 to 3; and n represents an integer of 0 to 10.

14. The circuit board according to claim 13, wherein in the general formula (I), A each independently represent a structural site represented by any one of general formulae (i-1) to (i-3) below, and Q each independently represent a linear alkylene chain having 3 to 7 carbon atoms or ethyleneoxyethylene
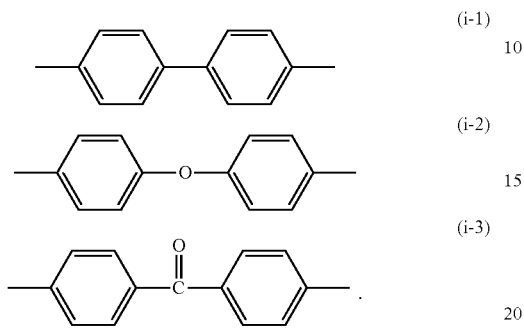
* * * * *